(12) United States Patent
Sashida et al.

(10) Patent No.: US 7,893,472 B2
(45) Date of Patent: Feb. 22, 2011

(54) FERROELECTRIC MEMORY DEVICE, FERROELECTRIC MEMORY MANUFACTURING METHOD, AND SEMICONDUCTOR MANUFACTURING METHOD

(75) Inventors: Naoya Sashida, Kawasaki (JP); Katsuyoshi Matsuura, Shinjuku (JP)

(73) Assignee: Fujitsu Semiconductor Limited, Yokohama (JP)

( * ) Notice: Subject to any disclaimer, the term of this patent is extended or adjusted under 35 U.S.C. 154(b) by 365 days.

(21) Appl. No.: 12/177,621

(22) Filed: Jul. 22, 2008

(65) Prior Publication Data

US 2008/0277706 A1 Nov. 13, 2008

Related U.S. Application Data

(63) Continuation of application No. PCT/JP2006/301242, filed on Jan. 26, 2006.

(51) Int. Cl.
*H01L 27/105* (2006.01)

(52) U.S. Cl. ............... 257/295; 257/E27.104; 257/E21.663; 257/E21.664; 438/3

(58) Field of Classification Search ............... 257/295, 257/E27.104, E21.663, E21.664; 438/3
See application file for complete search history.

(56) References Cited

U.S. PATENT DOCUMENTS

| | | | |
|---|---|---|---|
| 6,727,156 B2 | 4/2004 | Jung et al. | |
| 6,888,189 B2 * | 5/2005 | Matsushita et al. | 257/310 |
| 7,176,132 B2 | 2/2007 | Sashida et al. | |
| 7,250,679 B2 | 7/2007 | Otsuka | |
| 7,417,274 B2 * | 8/2008 | Ozaki et al. | 257/295 |
| 7,790,476 B2 * | 9/2010 | Sashida | 438/3 |
| 2005/0272247 A1 | 12/2005 | Ikeda et al. | |

FOREIGN PATENT DOCUMENTS

| | | |
|---|---|---|
| JP | 8-76352 A | 3/1996 |
| JP | 2001-149423 A | 6/2001 |
| JP | 2002-198496 A | 7/2002 |
| JP | 2004-153031 A | 5/2004 |
| JP | 2005-136301 A | 5/2005 |
| JP | 2005-347472 A | 12/2005 |
| KR | 2002-16345 A | 3/2002 |

OTHER PUBLICATIONS

International Search Report of PCT/JP2006/301242, date of mailing May 2, 2006.
Korean office Action dated Nov. 5, 2010, issued in corresponding Korean Patent Application No. 10-2010-7017271.

* cited by examiner

*Primary Examiner*—Anh Phung
*Assistant Examiner*—Michael Lulis
(74) *Attorney, Agent, or Firm*—Westerman, Hattori, Daniels & Adrian, LLP

(57) ABSTRACT

A ferroelectric memory device manufacturing method includes the steps of forming an interlayer isolating film for covering a transistor formed on a semiconductor substrate; forming a conductive plug in the interlayer insulating film to contact a diffusion region of the transistor formed on the semiconductor substrate; forming a ferroelectric capacitor including a lower electrode, a ferroelectric film and an upper electrode; and forming a compound film including silicon (Si) and a CH group on a surface of the interlayer insulating film and a surface of the conductive plug by depositing a Si compound containing Si atoms and the CH groups; wherein the compound film is formed after forming the conductive plug, and the compound film is formed before forming the lower electrode; and a self-orientation film is formed on a surface of the compound film.

6 Claims, 22 Drawing Sheets

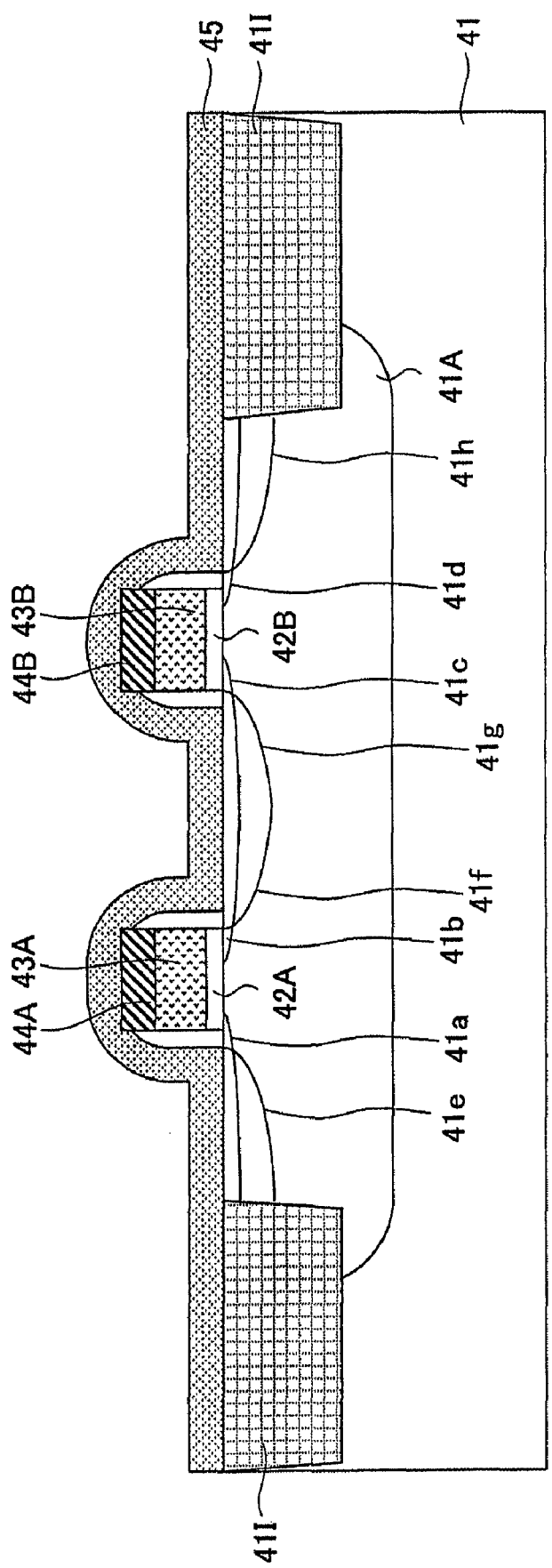

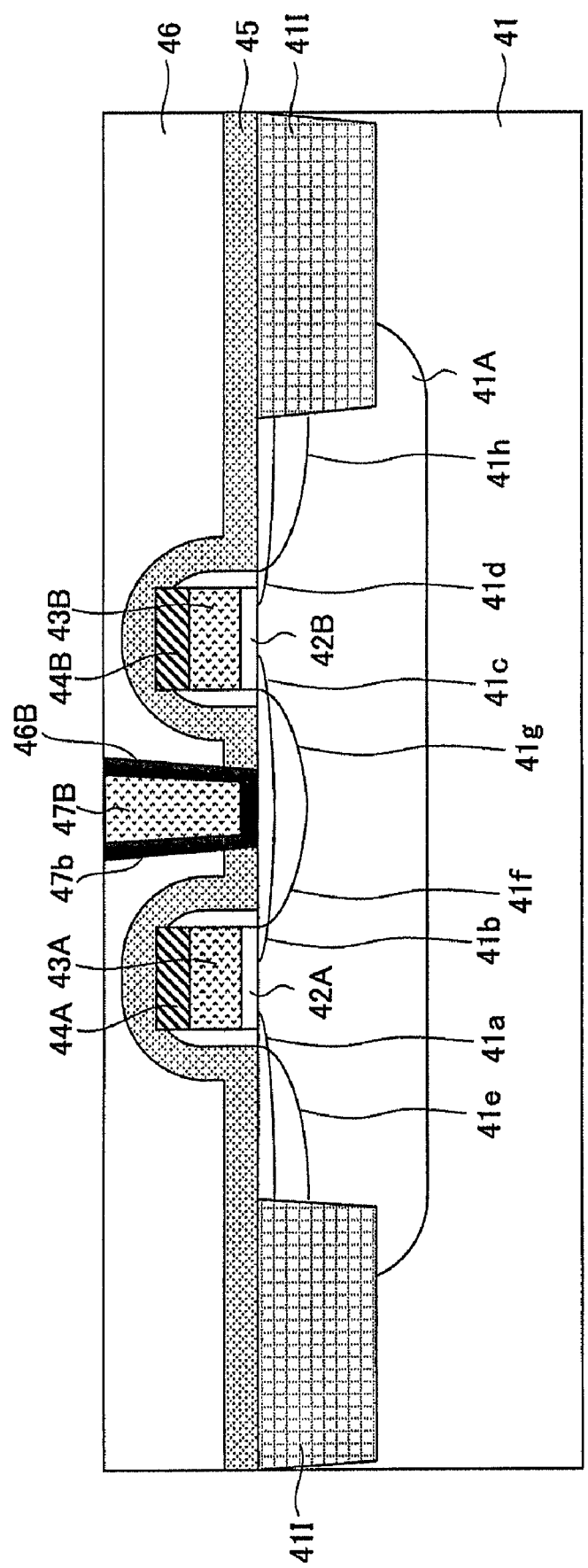

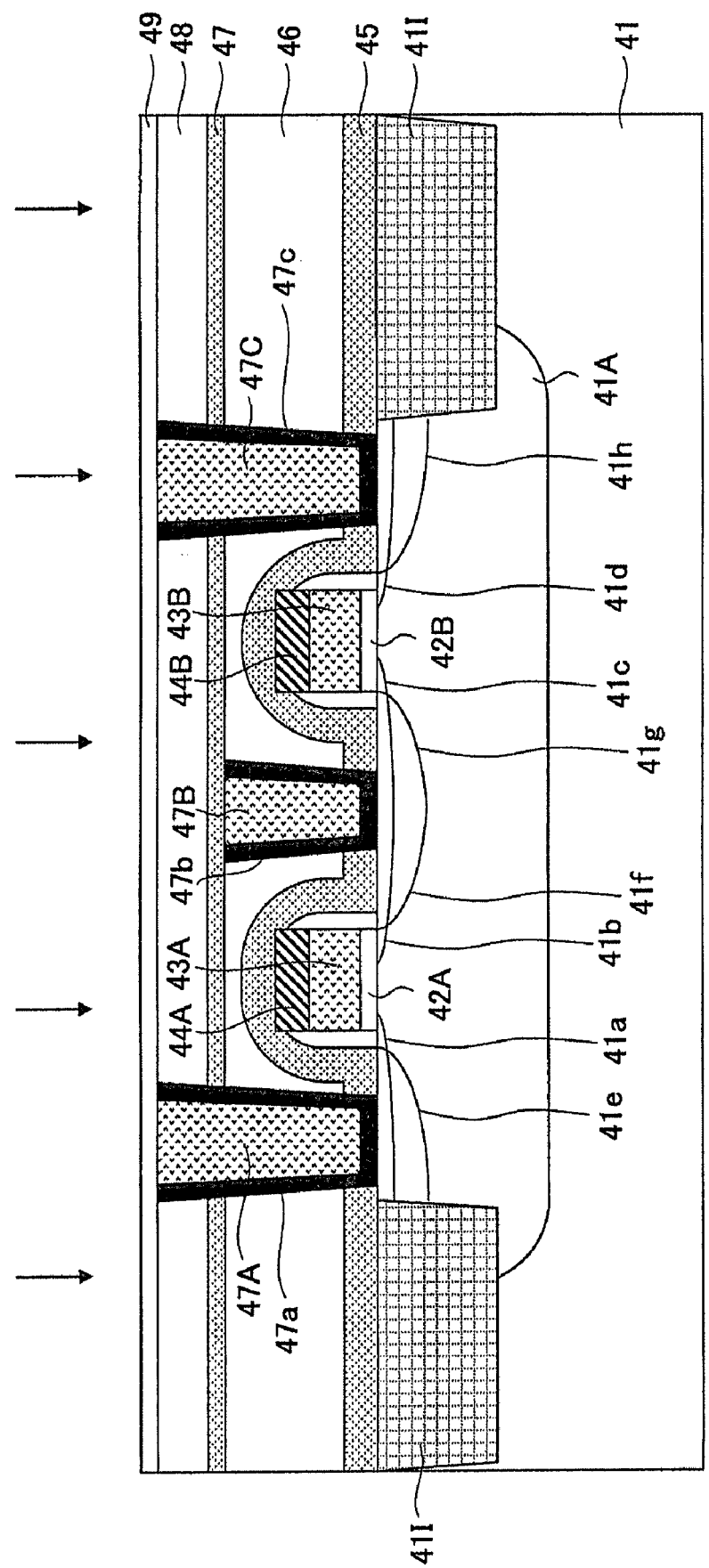

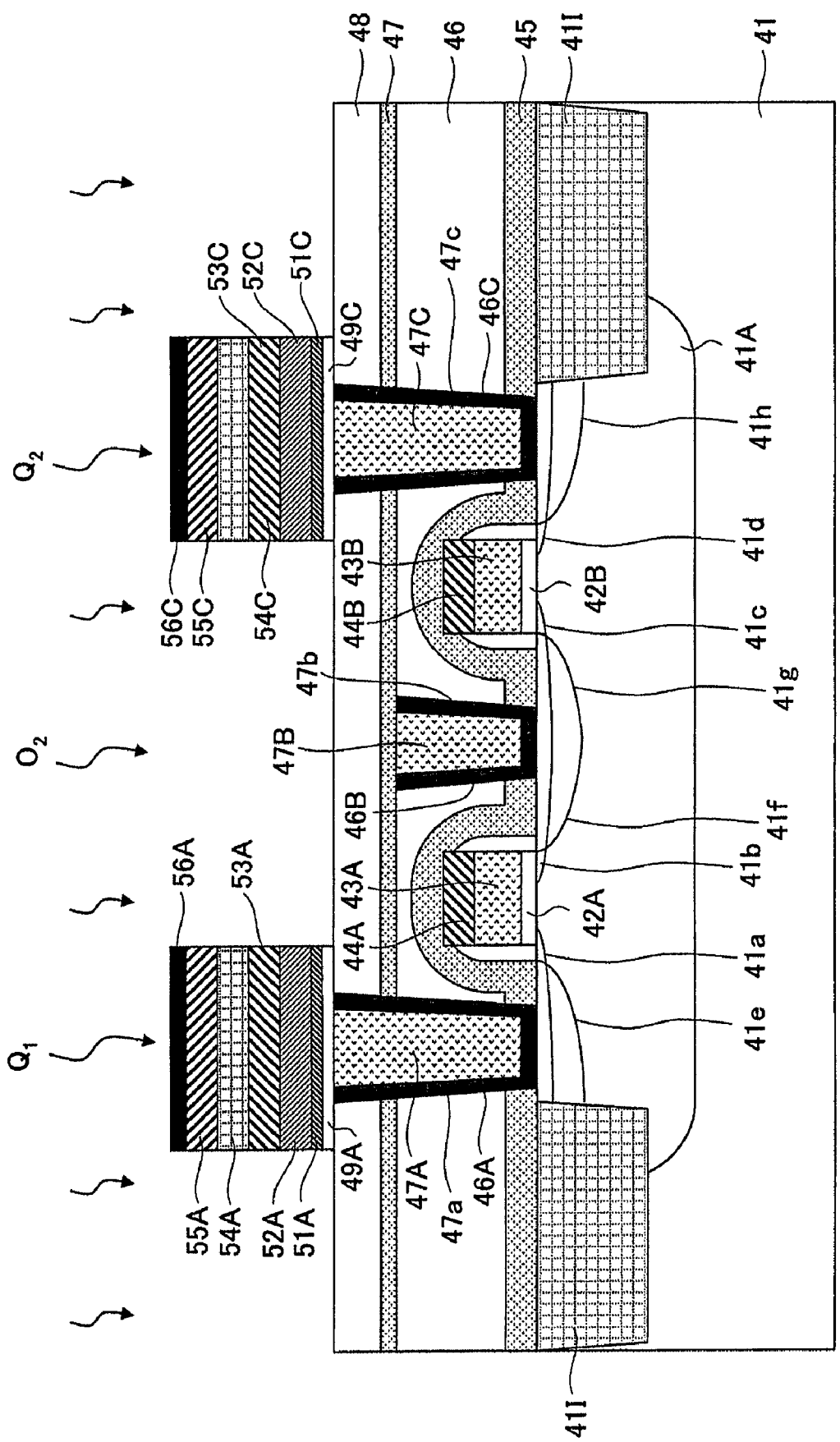

though a perovskite film belongs to a tetragonal group, the probabilities for obtaining (001) orientation grains and (100) orientation grains are similar in a PZT film formed by a conventional fabrication technique, because the angle of the c-axis is similar to that of the a-axes in a perovskite film. If taking account of a number of other orientations, a small portion ratio of all the grains in the film would contribute to actual operation of the ferroelectric capacitor. Because of these issues, in the ferroelectric memory device technology, ferroelectric films 19A, 19C are formed to obtain approximately (111) orientation films and arranged in
FERROELECTRIC MEMORY DEVICE, FERROELECTRIC MEMORY MANUFACTURING METHOD, AND SEMICONDUCTOR MANUFACTURING METHOD

CROSS-REFERENCE TO RELATED APPLICATION

This application is a continuation application filed under 35 U.S.C. 111(a) claiming the benefit under 35 U.S.C. 120 and 365(c) of a PCT International Application No. PCT/JP2006/301242 filed Jan. 26, 2006, in the Japanese Patent Office, the disclosure of which is hereby incorporated by reference.

BACKGROUND

1. Field

The present invention generally relates to a semiconductor device, which may include a ferroelectric capacitor and a semiconductor manufacturing method.

2. Description of the Related Art

Conventionally, ferroelectric memories, which are nonvolatile memory elements, are operated by bias voltages. Ferroelectric memories perform fast operations with low power consumption and retain stored information even if the bias voltages are turned off, which is preferable for memory devices. The ferroelectric memories are applied to IC cards and mobile electronic devices.

FIG. 1 is an illustration showing a cross section of a ferroelectric memory device called a stack type memory.

Referring to FIG. 1, a ferroelectric memory device 10 is called a 1T1C type (one-transistor and one capacitor) device. Two memory transistors are formed in a device region 11A isolated by an isolation region 11I formed on a silicon substrate 11, which two transistors are formed to have a common bit line.

More specifically, an n-type well is formed in the silicon substrate 11 as the device region 11A. In the device region 11A, a first MOS (metal-oxide-semiconductor) transistor having a poly silicon gate electrode 13A and a second MOS transistor having a poly silicon gate electrode 13B are formed on a gate insulating film 12A and a gate insulating film 12B, respectively.

Further, p⁻ type LDD (lightly-doped-drain) regions 11a and 11b are formed to correspond to sidewalls of the poly silicon gate electrode 13A in the silicon substrate 11. Other p type LDD regions 11c and 11d are formed to correspond to sidewalls of the poly silicon gate electrode 13B in the silicon substrate 11. The first and second MOS transistors are formed in the device region 11A in common, so that the same p⁻ type diffusion region is used common to the LDD region 11b and the LDD region 11c.

A silicide layer 14A is formed on the poly silicon gate electrode 13A and a silicide layer 14B is formed on the poly silicon gate electrode 13B. Further, sidewall insulating films are formed on sidewalls of the poly silicon gate electrode 13A and the poly silicon gate electrode 13B, respectively.

Further, p⁺ type diffusion regions 11e and 11f are formed outside of the sidewall insulating films of the poly silicon gate electrode 13A in the silicon substrate 11, and also p⁺ type diffusion regions 11g and 11h are formed outside of the sidewall insulating films of the poly silicon gate electrode 13B in the silicon substrate 11. The diffusion region 11f and 11g are configured by the same p⁺ type diffusion region.

Further, a SiON (silicon oxynitride) film 15 is formed on the silicon substrate 11 for covering both the poly silicon gate electrode 13A with its sidewall insulating films and the silicide layer 14A and the poly silicon gate electrode 13B with its sidewall insulating films and the silicide layer 14B. A first interlayer insulating film 16 made of SiO₂ is formed on the SiON film 15. Contact holes 16A, 16B, and 16C are formed in the first interlayer insulating film 16 for exposing the surfaces of the diffusion regions 11e, 11f (in common with 11g), and 11h. W (tungsten) via plugs 17A, 17B, and 17C are formed through intermediate layers 17a, 17b, and 17c formed by stacking a Ti (titanium) film and a TiN (titanium nitride) film in the contact holes 16A, 16B, and 16C, respectively.

On the first interlayer insulating film 16, a first ferroelectric capacitor C1 is formed by a sandwich film of a lower electrode 18A, a poly ferroelectric film 19A and an upper electrode 20A, contacting the W plug 17A. Likewise, a second ferroelectric capacitor C2 is formed by a sandwich film of a lower electrode 18C, a poly ferroelectric film 19C and a upper electrode 20C contacting the W plug 17C.

Further, a hydrogen barrier film 21 made of Al₂O₃ is formed on the first interlayer insulating film 16 for covering the ferroelectric capacitors C1 and C2, and a second interlayer insulating film 22 is formed on the hydrogen barrier film 21.

Further, a contact hole 22A exposing the upper electrode 20A of the ferroelectric capacitor C1, a contact hole 22B exposing the W via plug 17B, and a contact hole 22C exposing the upper electrode 20C of the ferroelectric capacitor C2 are formed in the second interlayer insulating film 22. For the contact holes 22A, 22B, and 22C, W plugs 23A, 23B, and 23C are formed through individual contact films 23a, 23b, and 23c, respectively, formed by a sandwich film of a Ti film and a TiN film.

Al wiring patterns having Ti/TiN stacked structures 24A, 24B, and 24C, are formed on the second interlayer insulating film 22, where individual wiring patterns correspond to W plugs 23A, 23B, and 23C, respectively.

The orientation of the ferroelectric films 19A and 19C in the ferroelectric capacitors C1 and C2 is an important characteristic for ferroelectric memory devices.

A perovskite film such as PZT (Pb (Zr, Ti) O₃) belongs to a tetragonal group. Self-orientation determines a ferroelectric property of a crystal, and the ferroelectric property is induced by displacement of Zr or Ti atoms in c-axis directions of a crystal lattice. It is suitable for the c-axes of individual crystal grains in a ferroelectric film to be parallel to an applied electric field, when a capacitor insulating film of a ferroelectric capacitor is formed of a perovskite film. Therefore, it is preferable for the orientation to be perpendicular ((001) orientation) to a plane of the capacitor insulating film. In contrast, it is difficult to induce a desired self-orientation by applying bias voltage to the capacitor if the orientation of the c-axis of the capacitor insulating film is distributed in a plane ((100) orientation).

However, although a perovskite film belongs to a tetragonal group, the probabilities for obtaining (001) orientation grains and (100) orientation grains are similar in a PZT film formed by a conventional fabrication technique, because the angle of the c-axis is similar to that of the a-axes in a perovskite film. If taking account of a number of other orientations, a small portion ratio of all the grains in the film would contribute to actual operation of the ferroelectric capacitor. Because of these issues, in the ferroelectric memory device technology, ferroelectric films 19A, 19C are formed to obtain approximately (111) orientation films and arranged in a <111> direction by bias voltage so that a relatively large switching electronic charge $Q_{sw}$ is obtained.

To achieve the orientation of a ferroelectric film, it is important to control the orientation of the lower electrodes 18A and 18C. Thereby, a Ti film is used for obtaining self-orientation as an orientation control film. A metallic film or a conductive oxide material, such as an Ir film, a Pt film, an $IrO_x$ film, or a $RuO_x$ film, is used as an orientation control film having (111) orientation. A Ti film indicates (002) orientation.

On the other hand, for a case where a Ti film is used as an orientation control film, as shown in FIG. 1, when a Ti film is deposited on a film such as a silicon dioxide film, the Ti atoms are immediately tightly bound with oxygen atoms, as shown in FIG. 2, because Ti atoms of the Ti film are highly reactive with oxygen atoms exposed on a surface of a film that has oxygen atoms on its surface. As a result, the degree of the self-orientation is reduced because the self-orientation requires free Ti atoms moving on the film surface. This reduces the proportion of desired (002) orientation grains of a formed Ti film. Further, in some cases, the c-axis of crystal grains of a Ti film obliquely aligns to a main plane of a silicon oxide film 16. As a result, many crystal grains having undesired orientation (not aligned to (002) orientation) are formed.

Patent document 1 describes that when the contact plugs 17A-17C of FIG. 1 have been formed, the surface of the interlayer insulating film 16 is processed by $NH_3$ plasma treatment as shown in FIG. 3 so that NH groups are bound with oxygen atoms at the surface of the interlayer insulating film 16.

According to the above configuration, even if a Ti film is deposited on the interlayer insulating film 16, Ti atoms on the film are not captured by oxygen atoms as shown in FIG. 4 and freely move on the surface of the interlayer insulating film 16. As a result, a self-oriented Ti film having (002) orientation is formed on the interlayer insulating film 16.

In succession, the lower electrodes 18A and 18C are formed on the Ti film by the above technique, and followed by formation of ferroelectric films 19A and 19C, respectively, on the film. Thus a ferroelectric film dominated by crystal grains having (111) orientation may be obtained.

However, for the technique described in Patent document 1, as the lower electrode 18A or 18C is directly formed on the W plug 17A or 17C, the crystal direction of the W plug 17A or 17C formed of poly crystal metal such as poly crystal tungsten, may still maintain its influence, even when $NH_3$ plasma treatment is performed. Therefore, controlling the self-orientation of a Ti film for most of the ferroelectric film 19A or 19C is not effectively achieved.

Patent document 1: Japanese Patent Application Publication 2004-153031

Patent document 2: Japanese Patent Application Publication H8-76352

Patent document 3: Japanese Patent Application publication 2001-149423

SUMMARY

It is an aspect of the embodiments discussed herein to provide a ferroelectric memory device manufacturing method, including: forming an interlayer isolating film for covering a transistor formed over a semiconductor substrate; forming a conductive plug in the interlayer insulating film to contact a diffusion region of the transistor formed on the semiconductor substrate; forming a ferroelectric capacitor over the conductive plug by stacking in the order of a lower electrode, a ferroelectric film and an upper electrode; and forming a compound film including silicon (Si) and a CH group on a surface of the interlayer insulating film and a surface of the conductive plug by depositing an Si compound containing Si atoms and the CH groups after forming the conductive plug and before forming the lower electrode; and forming a self-orientation film on a surface of the compound film.

Other objects, features, and advantages of the present embodiment will become more apparent from the following detailed description when read in conjunction with the accompanying drawings.

The present embodiment may provide a simple process which includes preferable advantages for effective productivity.

BRIEF DESCRIPTION OF THE DRAWINGS

FIG. 6B is an illustration for describing a fabrication process (step 2) of the ferroelectric memory device of FIG. 5;

FIG. 6C is an illustration for describing a fabrication process (step 3) of the ferroelectric memory device of FIG. 5;

FIG. 6E is an illustration for describing a fabrication process (step 5) of the ferroelectric memory device of FIG. 5;

FIG. 6K is an illustration for describing a fabrication process (step 11) of the ferroelectric memory device of FIG. 5;

DETAILED DESCRIPTION OF THE PREFERRED EMBODIMENTS

A description is given below, with reference to the FIG. 5 through FIG. 12 of embodiments.

First Embodiment

Figure 1:
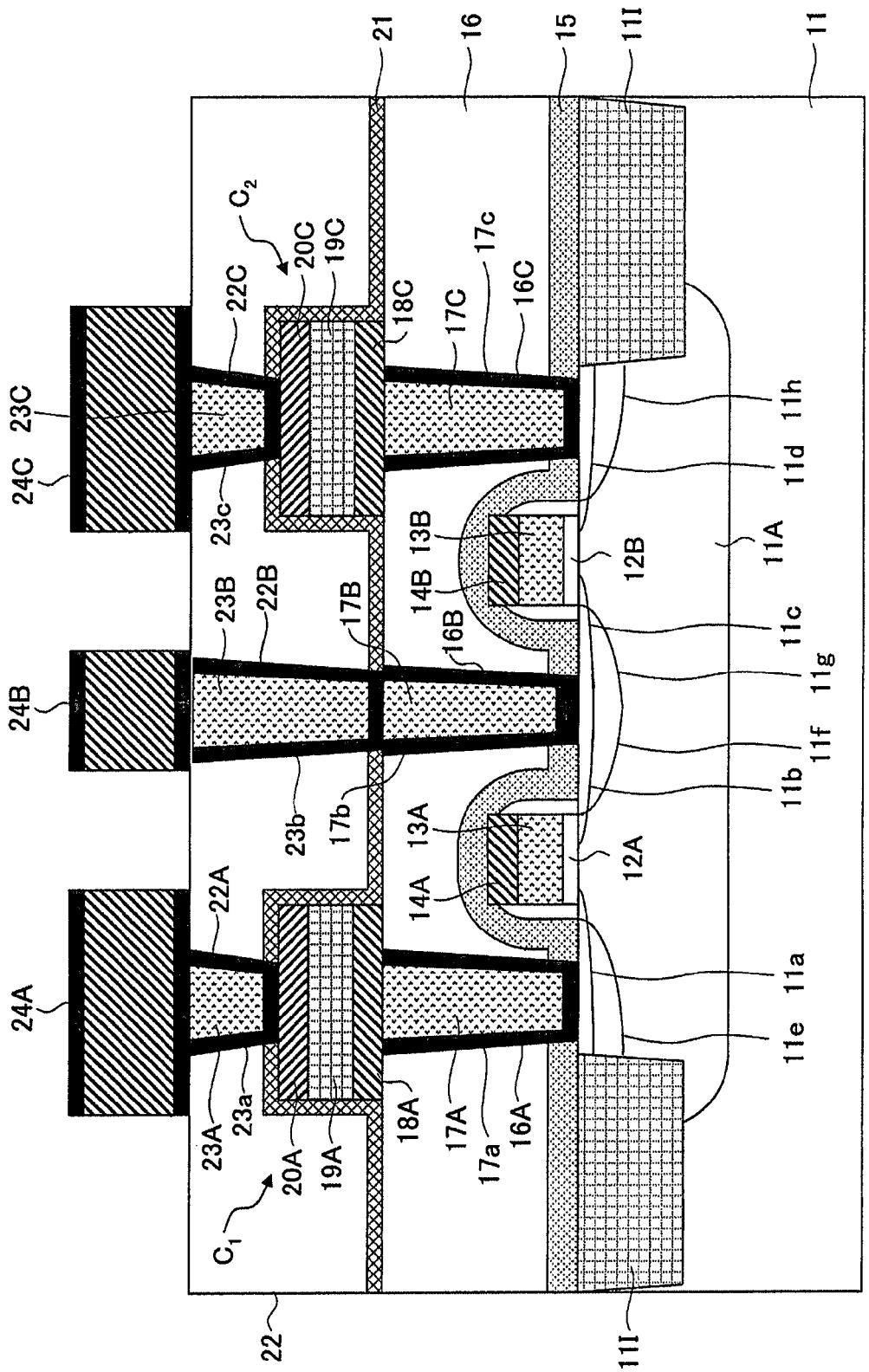
FIG. 1 is an illustration showing a configuration of a conventional ferroelectric memory device.
Figure 2:
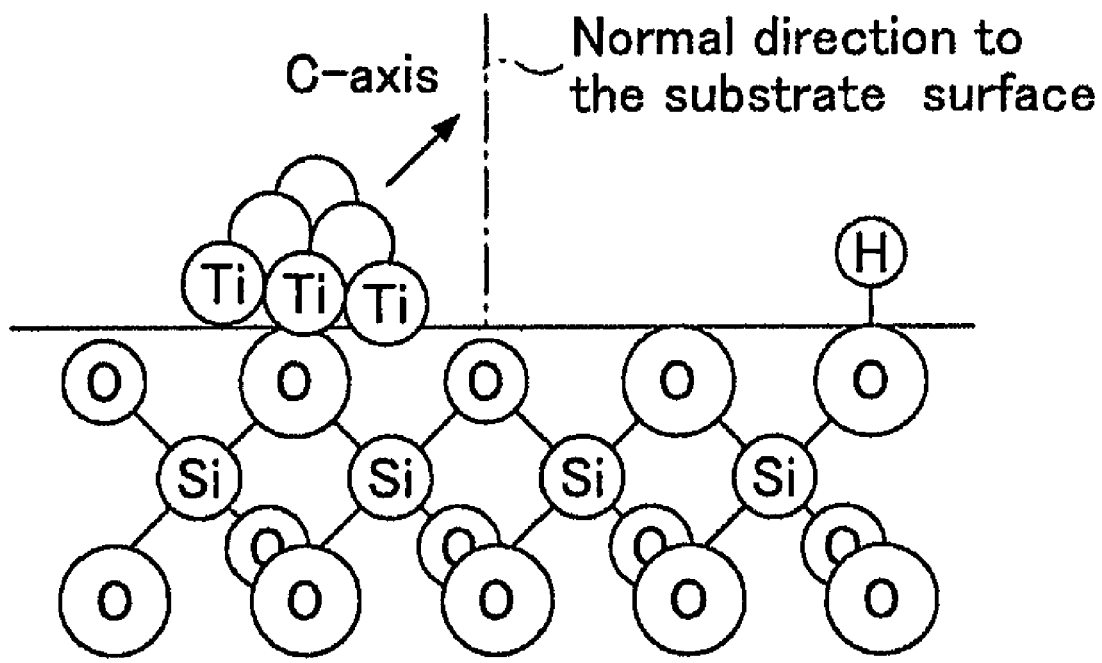
FIG. 2 is an illustration for describing issues of the conventional technique.
Figure 3:
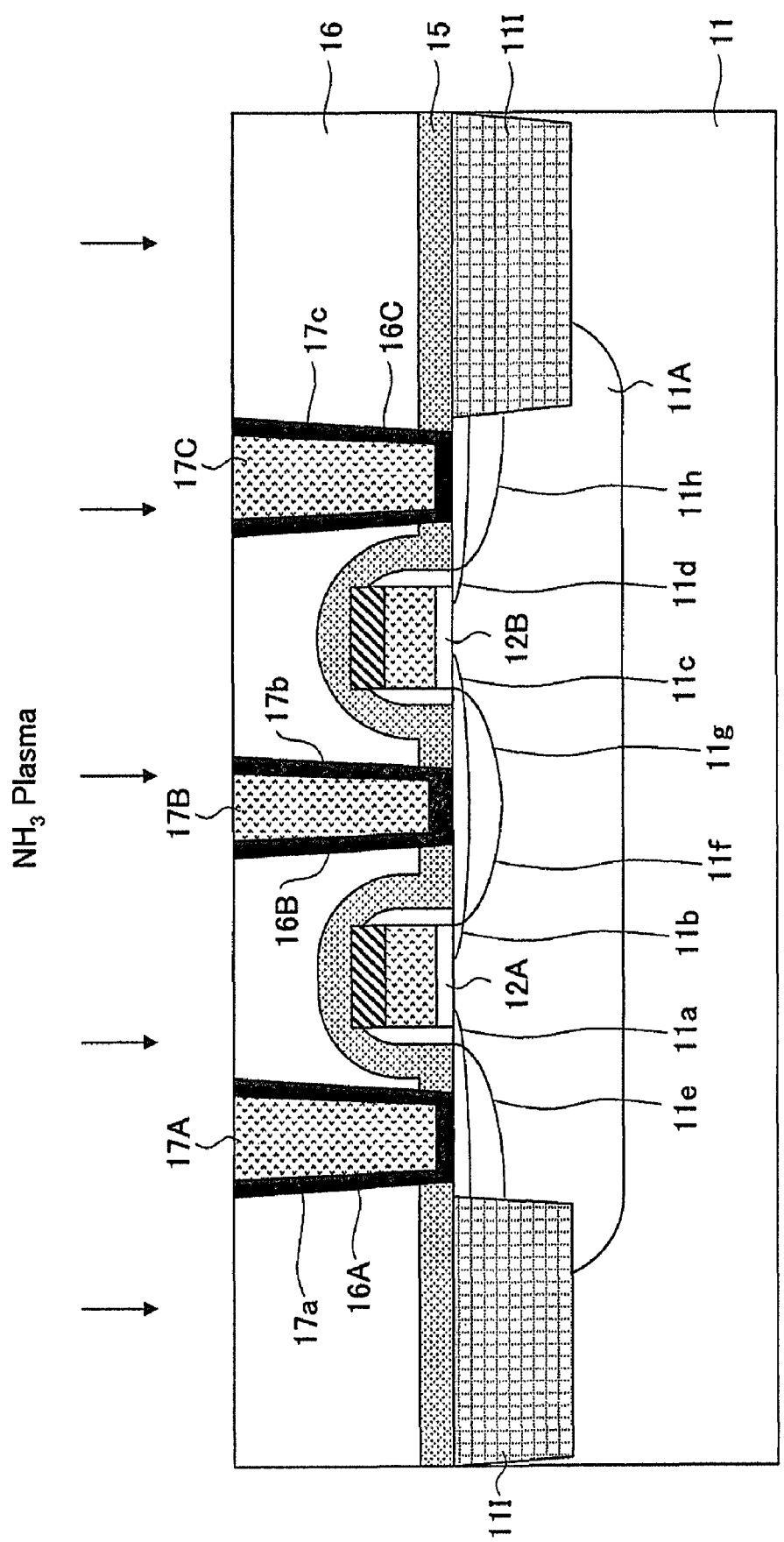
FIG. 3 is an illustration for describing a a related art case.
Figure 4:
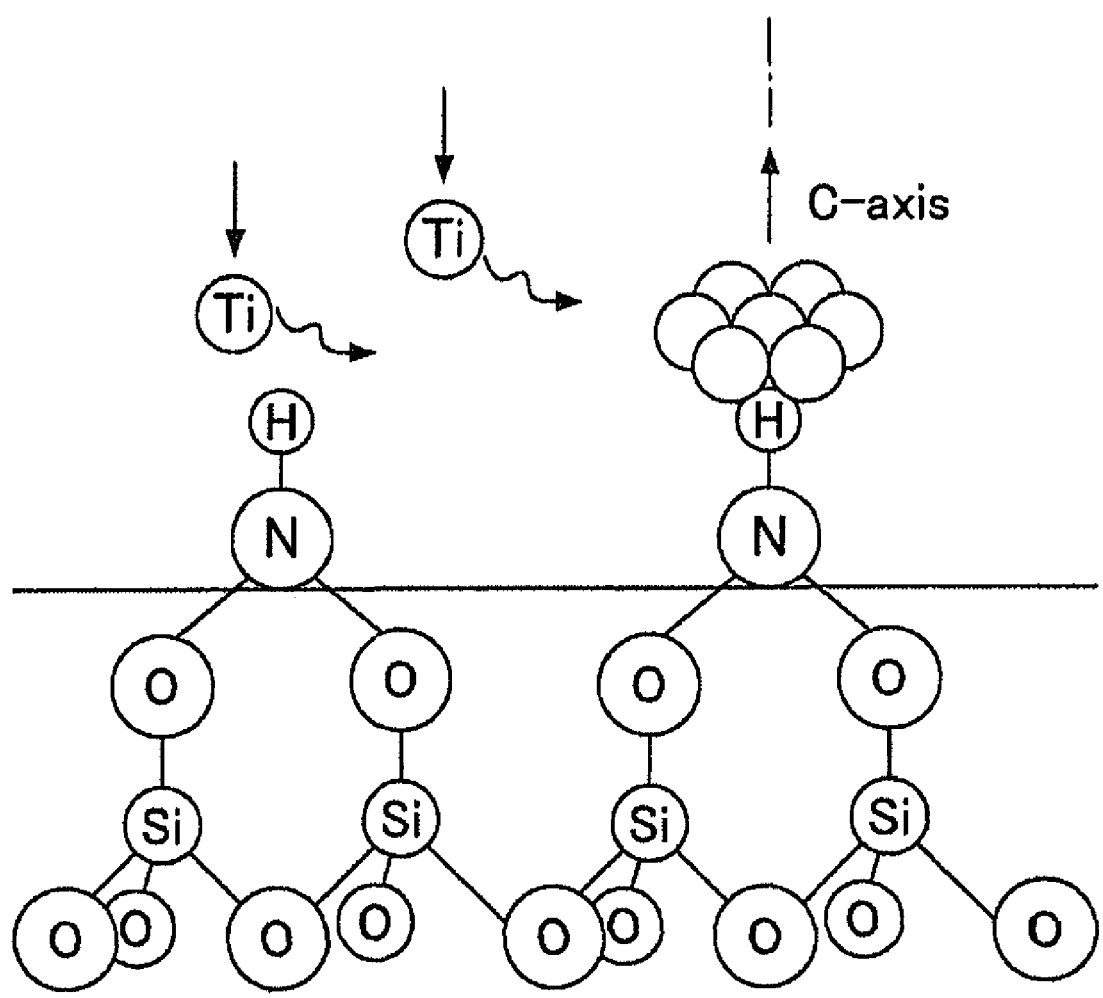
FIG. 4 is an illustration for describing a fundamental problem of a related art case.
Figure 5:
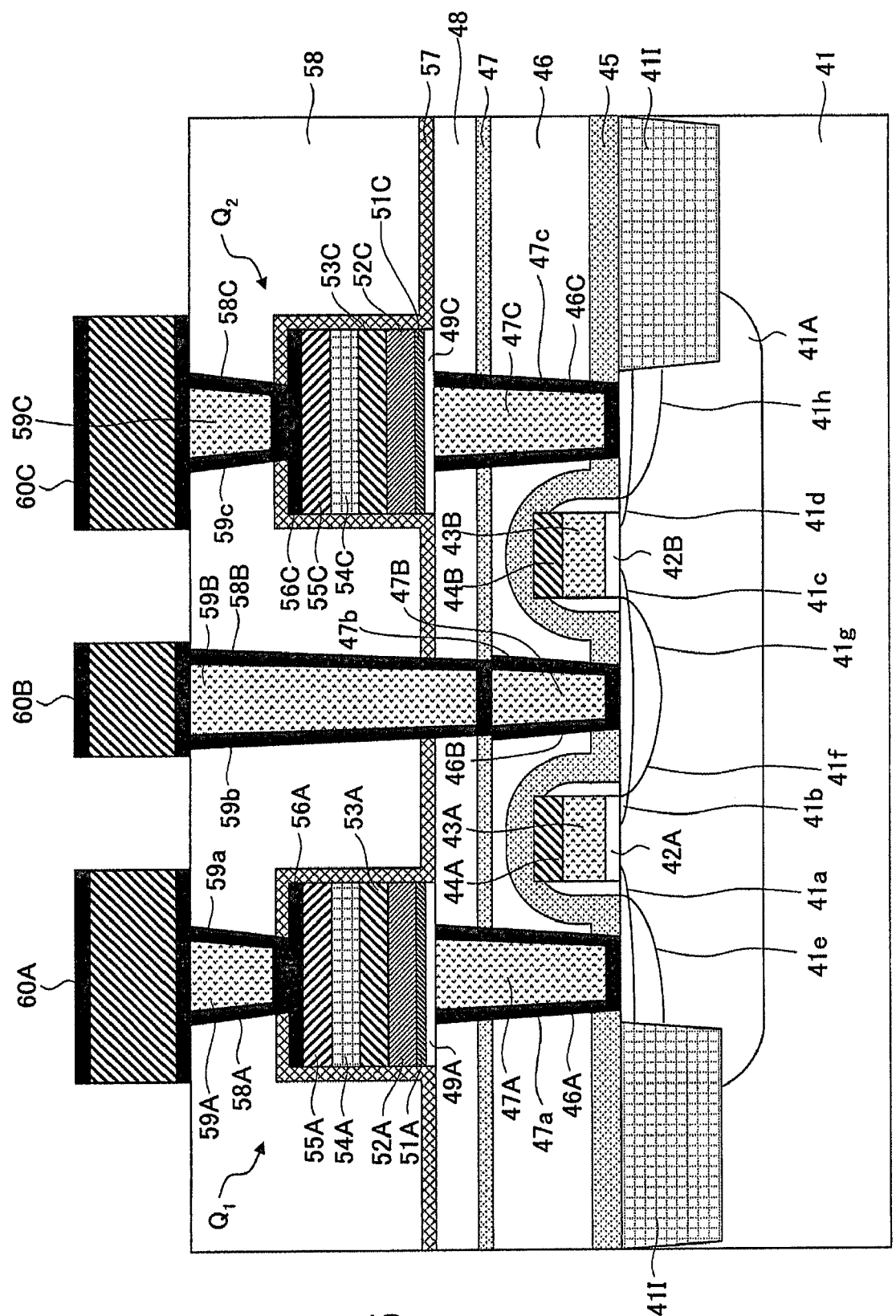
FIG. 5 is an illustration showing a configuration of a ferroelectric memory device according to a first embodiment.

FIG. 5 shows a configuration of a ferroelectric memory device 40 according to a first embodiment.

Referring to FIG. 5, a ferroelectric memory device 40 is called a 1T1C (one transistor and one capacitor) type device and two memory transistors are formed in a device region 41A isolated by STI (shallow trench isolation) type device isolation regions 41I, in which two memory transistors are formed to have a common bit line.

More specifically, an n-type well is formed in the silicon substrate 41 as the device region 41A. In the device region 41A, a first MOS (metal-oxide-semiconductor) transistor having a poly silicon gate electrode 43A and a second MOS transistor having a poly silicon gate electrode 43B are formed on a gate insulating film 42A and a gate insulating film 42B, respectively.

Further, p⁻ type LDD (lightly-doped-drain) regions 41a and 41b are formed to correspond to sidewalls of the poly silicon gate electrode 43A in the silicon substrate 41. Other p⁻ type LDD regions 41c and 41d are formed to correspond to sidewalls of the poly silicon gate electrode 43B in the silicon substrate 41. The first and second MOS transistors are formed in the device region 41A in common, so that the same p⁻ type diffusion region is used in common for the LDD region 41b and the LDD region 41c.

A silicide layer 44A is formed on the poly silicon gate electrode 43A and a silicide layer 44B is formed on the poly silicon gate electrode 43B. Further, sidewall insulating films are formed on sidewalls of the poly silicon gate electrode 43A and the poly silicon gate electrode 43B.

Further, p⁺ type diffusion regions 41e and 41f are formed outside of the sidewall insulating films of the poly silicon gate electrode 43A in the silicon substrate 41, and also p⁺ type diffusion regions 41g and 41h are formed outside of the sidewall insulating films of the poly silicon gate electrode 43B in the silicon substrate 41. The diffusion region 41f and 41g are configured by the same p⁺ type diffusion region.

Further, a SiON (silicon oxynitride) film 45 is formed on the silicon substrate 41 for covering both the poly silicon gate electrode 43A with the sidewall insulating films and the silicide layer 44A and the poly silicon gate electrode 43B with its sidewall insulating films and the silicide layer 44B. A first interlayer insulating film 46 made of $SiO_2$ is formed on the SiON film 45, and the succeeding process is followed by formation of a first anti-oxidation film 47 made of a SiN film or a SiON film and a second interlayer insulating film 48 made of a TEOS oxide film.

Further, contact holes 46A and 46C are formed to penetrate the interlayer insulating film 46, the interlayer insulating film 48 and the first anti-oxidation film 47 for exposing the diffusion regions 41e and 41h. First W (tungsten) via plugs 47A and 47C are formed in the contact holes 46A and 46C through an intermediate layer formed by a Ti film and a TiN film. Further, in the interlayer insulating film 46 is formed a contact hole 46B exposing the diffusion region 41f (in common with the diffusion region 41g), and a first W via plug 47B is formed in the contact hole 46B through an intermediate layer including a Ti film and TiN film.

Further, a first ferroelectric capacitor Q1 is formed on the second interlayer insulating film 48 to contact the first W plug 47A. The first ferroelectric capacitor Q1 includes a lower electrode formed by a 100 nm thick TiAlN film 52A and a 100 nm thick Ir film 53A, a poly crystal ferroelectric film 54A formed by a 120 nm thick PZT film, and an upper electrode formed by a 200 nm thick $IrO_2$ film 55A. Likewise, a second ferroelectric capacitor Q2 is formed on the second interlayer insulating film 48 to contact the first W plug 47C. The second ferroelectric capacitor Q2 includes a lower electrode formed by a 100 nm thick TiAlN film 52C and a 100 nm thick Ir film 53C, a poly crystal ferroelectric film 54C formed by a 120 nm thick PZT film, and an upper electrode formed by a 200 nm thick $IrO_2$ film 55C.

In the present embodiment, a first transition layer 49A made of a Si compound is formed between the conductive first W plug 47A and the lower electrode (TiAlN film 52A). The first transition layer 49A may include a composition of SiCH (a Si compound containing silicon atoms and CH groups) containing silicon atoms and a methyl ($CH_3$) group having a thickness ranging from approximately more than one monolayer and less than approximately 10 nm. A Ti film 51A of approximately 20 nm in thickness having (002) orientation is formed on the first transition layer 49A according to the present embodiment.

Likewise, a second transition layer 49C is formed between the conductive first W plug 47C and the lower electrode (TiAlN film 52C). The second transition layer 49C made of the Si compound may include Si atoms and a methyl ($CH_3$) group with a composition of SiCH having a thickness ranging from approximately more than one monolayer and less than approximately 10 nm. A Ti film 51C of approximately 20 nm in thickness having (002) orientation is formed on the second transition layer 49C according to the present embodiment.

According to such a configuration, the orientation of the lower electrodes films 52A and 53A formed on the Ti film 51A having (002) orientation is aligned to the <111> direction, and the PZT film 54A deposited on that surface aligns to the <111> direction. Likewise, the PZT film 54C aligns to the <111> direction because the PZT film 54C is formed on the lower electrode films 52C and 53C that are aligned to the <111>, which lower electrode films 52C and 53C are formed on the Ti film 51C having (002) orientation. As a result, each of ferroelectric capacitors Q1 and Q2 has a large switching charge $Q_{sw}$.

Further, a hydrogen barrier film 57 including $Al_2O_3$ is formed to cover the first ferroelectric capacitor Q1 and the second ferroelectric capacitor Q2 on the second interlayer insulating film 48. The hydrogen barrier film 57 is approximately 10 nm thick, and a third interlayer insulating film 58 is formed on the hydrogen barrier film 57.

Further, in the third interlayer insulating film 58 is formed a contact hole 58A exposing hydrogen barrier metal 56A formed on the upper electrode 55A of the first ferroelectric capacitor Q1, a contact hole 58B exposing the via hole 46B, and a contact hole 58C exposing hydrogen barrier metal 56C formed on the upper electrode 55C of the second ferroelectric capacitor Q2. Further, in the contact hole 58A is formed a second W plug 59A through an intermediate film 59a formed by a Ti film and a TiN film. In the contact hole 58B is formed a second W plug 59B through an intermediate film 59b formed by a Ti film and a TiN film. The contact hole 58C forms a second W plug 59C through and inter mediate film 59c formed by a Ti film and a TiN film.

Al wiring patterns 60A, 60B, and 60C are formed on the third interlayer insulating film 58 with barrier metal films having Ti/TiN stacked structures contacting the second W plugs 59A, 59B, and 59C, respectively.

Further, the conducting type (p-type or n-type) of the present embodiment may be exchanged.

Referring to FIGS. 6A-6L, the fabrication process of the ferroelectric memory device 40 will be described below.

Figure 6A:
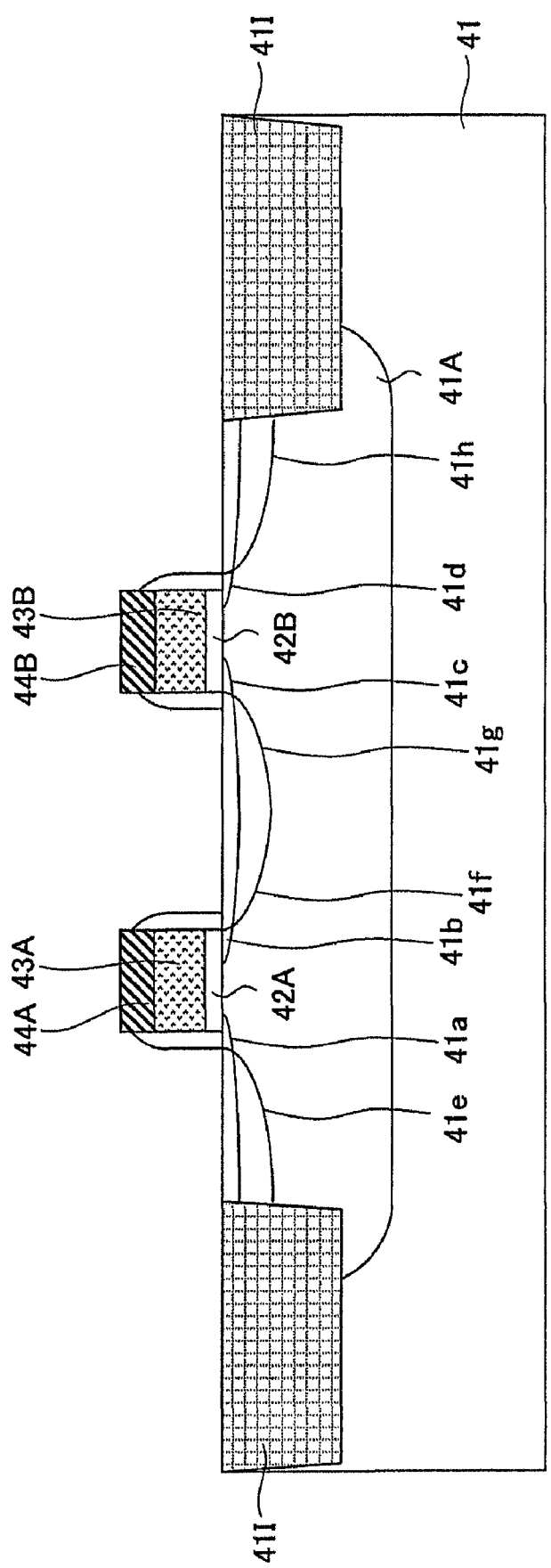
FIG. 6A is an illustration for describing a fabrication process (step 1) of the ferroelectric memory device of FIG. 5.

Referring to FIG. 6A, the silicon substrate may be a p-type or an n-type silicon substrate. A device region 41A may be formed by an n-type well that is isolated by a STI type device isolation region 41I.

A poly silicon gate electrode 43A of a first MOS transistor and a poly silicon gate electrode 43B of a second MOS transistor are formed on the device region 41A through gate insulating films 42A and 42B, respectively.

Further, p⁻ type LDD regions 41a and 41b are formed in the silicon substrate 41 for corresponding to sidewalls of the gate electrode 43A. Likewise, p⁻ type LDD regions 41c and 41d are formed in the silicon substrate 41 for corresponding sidewalls of the gate electrode 43B. The p⁻ type LDD regions 41a, 41b, 41c, and 41d are formed by an ion implantation process using the gate electrodes 43A and 43B as self-alignment masks. The first and second MOS transistors are formed in common in the device region 41A, so that the LDD regions 41b and 41c are formed by the same p⁻ type diffusion region.

A silicide layer 44A is formed on the poly silicon gate electrode 43A and a silicide layer 44B is formed on the poly silicon gate electrode 43B, and sidewall insulating films are formed on individual sidewalls of the poly silicon gate electrodes 43A and 43B.

Further, p⁺ type diffusion regions 41e and 41f are formed outside of the sidewall insulating films of the gate electrode 43A in the silicon substrate 41, and p⁺ type diffusion regions 41g and 41h are formed outside of the sidewall insulating films of the gate electrodes 43B in the silicon substrate 41. The p⁺ type diffusion regions 41e, 41f, 41g, and 41h are formed by an ion implantation process using the individual sidewall insulating films and the gate electrode 43A and 43B as self-alignment masks, in which the p⁺ diffusion regions 41f and 41g are formed by the same p⁺ type diffusion region.

In the process of FIG. 6B, an approximately 200 nm thick SiON film 45 is formed on the structure of FIG. 6A by a plasma CVD technique.

Further, in the process step of FIG. 6C, an approximately 20 nm thick silicon oxide film, an approximately 80 nm thick silicon nitride film, and an approximately 1000 nm thick silicon oxide film are formed successively by a plasma CVD technique, then a CMP technique is performed to flatten the surface to form a first interlayer insulating film 46 having a thickness of approximately 700 nm.

Further, in the process step of FIG. 6C, in the first interlayer insulating film 46 may be formed a contact hole 46B to expose the diffusion region 41f (41g) with a diameter of approximately 0.25 μm. A W plug 47B is formed in the contact hole 46B to electrically contact the diffusion region 41f (41g) and fill the contact hole 46B through an intermediately film 47b which includes an approximately 30 nm thick Ti film and an approximately 20 nm thick TiN film. Further an unnecessary part of the W film of the W plug is removed.

Figure 6D:
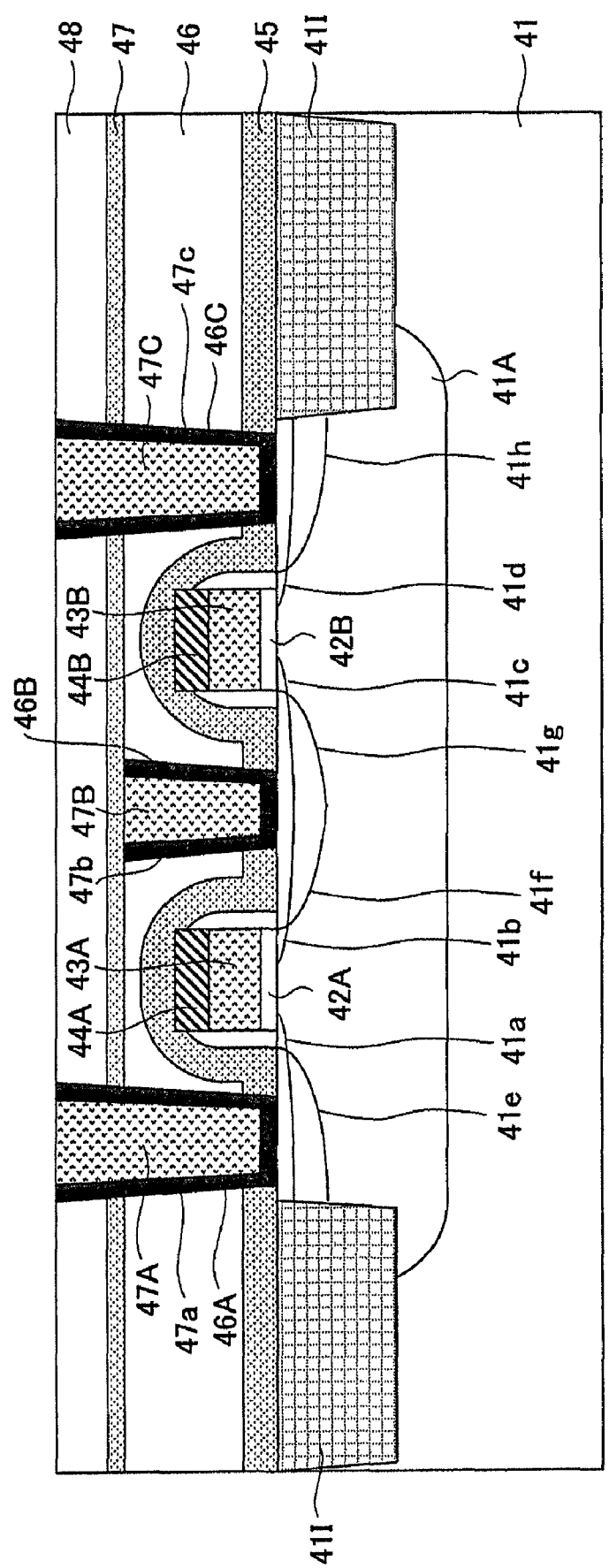
FIG. 6D is an illustration for describing a fabrication process (step 4) of the ferroelectric memory device of FIG. 5.

Next, in the process step of FIG. 6D, a first anti-oxidation film 47 of a SiON film approximately 130 nm thick, which is a Si compound containing silicon atoms and CH groups, is formed on the structure of FIG. 6C by a plasma CVD technique. Further, an approximately 130 nm thick silicon oxide film 48 is successively formed on the surface by a plasma CVD technique using TEOS material.

In FIG. 6D, contact holes 46A and 46C are formed to expose the diffusion regions 41e and 41h penetrating the second interlayer insulating film 48, the SiON film 47, and the first interlayer insulating film 46, in which the SiON film 47 is formed between the first and second interlayer insulating films 46 and 48. A W plug 47A is formed to fill the contact hole 46A and to electrically contact the diffusion region 41e. The W plug 47A is formed through an intermediate film 47a having a similar structure to the intermediate film 47b by a similar process to the W plug 47B formation. Likewise a W plug 47C is formed in the contact hole 46C to electrically contact the diffusion region 41h through an intermediate film 47c having a similar structure to the intermediate film 47b by a similar process to that of the W plug 47B formation.

In the present embodiment, for forming first and second ferroelectric capacitors Q1 and Q2 on the structure of FIG. 6D, the process of FIG. 6 may reduce the influence of the crystal property of the W plugs 47A and 47C on the first and second ferroelectric capacitors Q1 and Q2, respectively.

In the process of FIG. 6E, HMDS (hexamethyldisilazane: (Si $(CH_3)_3$—NH—Si $(CH_3)_3$) solution, a silicon compound containing silicon atoms and CH groups, is deposited on the structure of FIG. 6D as shown as step 1 in FIG. 7, and the structure is processed by a baking treatment at a temperature approximately 200° C. as shown as step 2 in FIG. 7, for example, in the air atmosphere for evaporating the solvent. As shown in FIG. 8, silicon atoms in HMDS dominantly bind metallic atoms on the surface of the plugs 47A, 47C and the second interlayer insulating film 48. As a result, a SiCH film 49 (silicon compound) including a Si$(CH_3)_3$ group is formed on the surface of the plugs 47A, 47C and the second interlayer insulating film 48 with a thickness ranging from an approximately one monolayer to approximately 1 nm.

Figure 7:
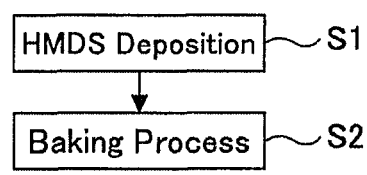
FIG. 7 is a flowchart for describing the process step of FIG. 6E.
Figure 8:
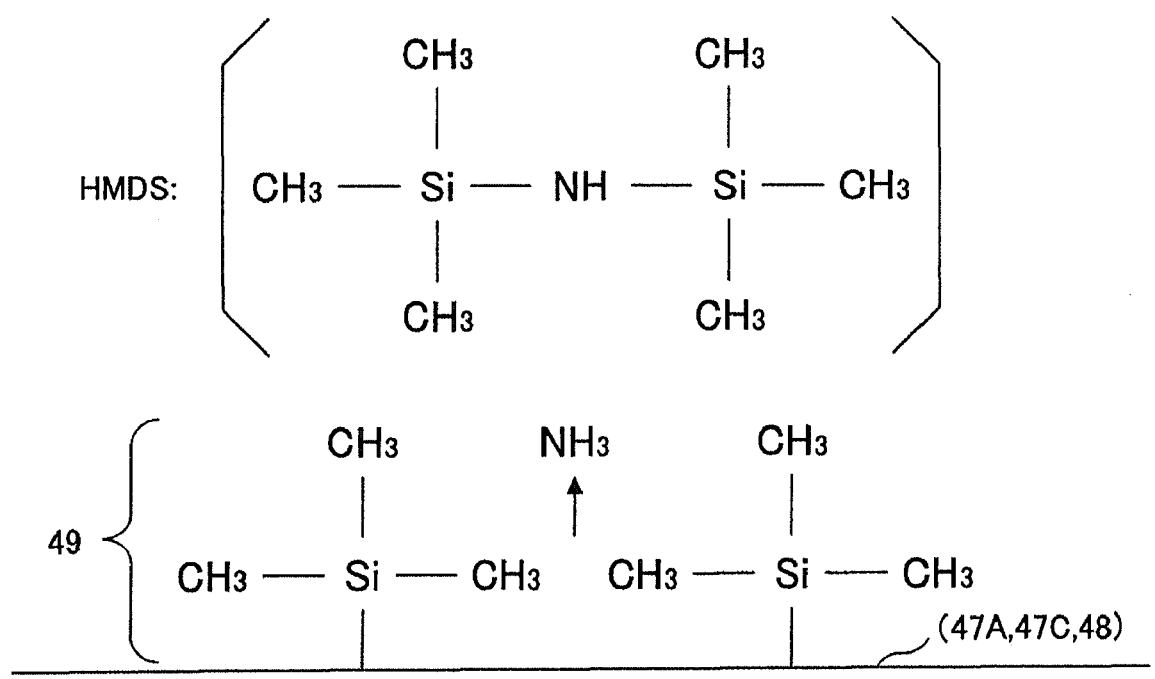
FIG. 8 is an illustration for describing the process step of SiCH film formation of FIG. 6E.

In the process step 2 of FIG. 7, the semiconductor substrate 41 is rotated at a rate ranging from approximately 3000 rpm to approximately 500 rpm, and HMDS liquid is deposited onto the substrate 41 with a flow rate of approximately 10 ml/second. The HMDS film formed by the above technique may form the SiCH film 49 having a thickness in ranging approximately one monolayer to approximately 1 nm by a baking treatment as shown in step 2 of FIG. 7.

In the present embodiment, it is expected that the crystal orientation of the conductive plugs 47A and 47C may be sufficiently screened by covering the surface with an approximately one monolayer of SiCH film 49 in the process of FIG. 6E.

Figure 6F:
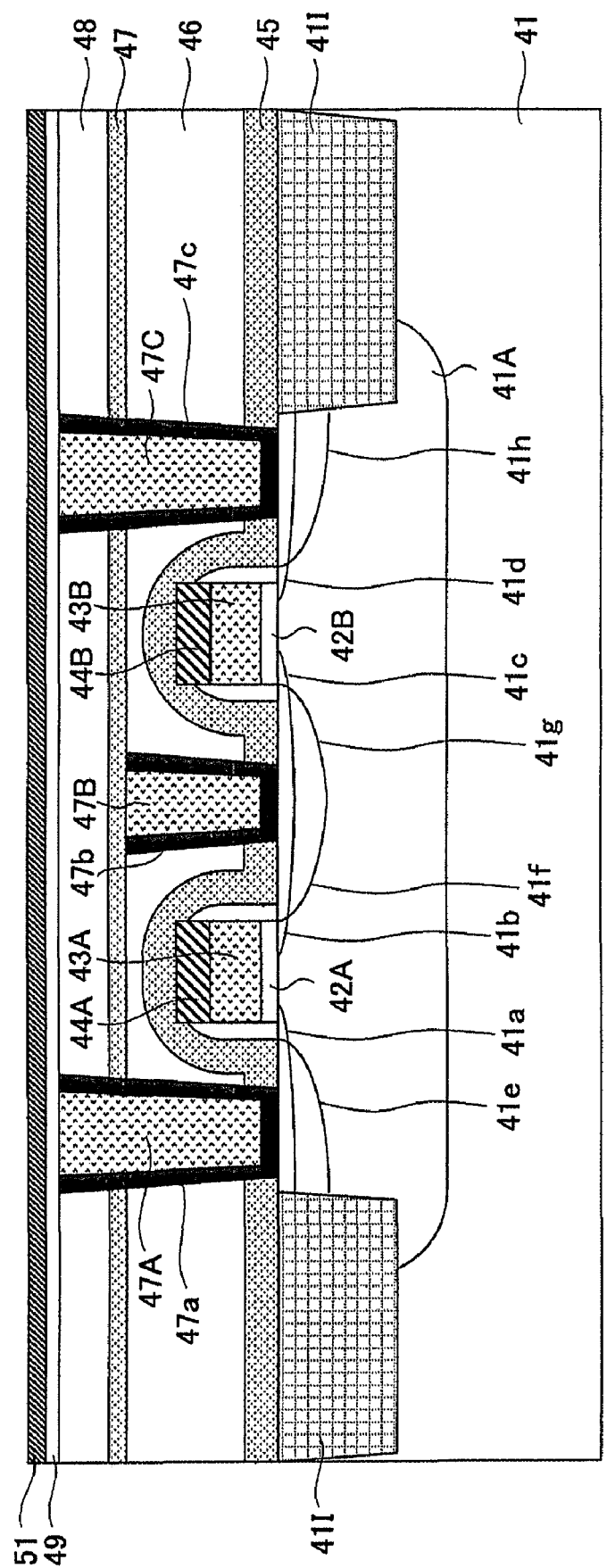
FIG. 6F is an illustration for describing a fabrication process (step 6) of the ferroelectric memory device of FIG. 5.

Next, in the process of FIG. 6F, a Ti film 51 with a thickness of approximately 20 nm is deposited on the SiCH film 49 of FIG. 6E by using a low temperature process such as a sputtering technique or the like.

In performing such a sputtering process for forming the Ti film 51, the distance between a substrate to be processed and a target material may be set as approximately 60 mm in a sputtering machine under a pressure of approximately 0.15 Pa of Ar atmosphere at a substrate temperature of approximately 20° C., in which sputtering DC power may be set about 2.6 kW for approximately 7 seconds.

In the structure of FIG. 6F, the Ti film 51 formed on the SiCH film 49 may show strong (002) orientation. In the present embodiment, the SiCH film 49 is formed on the second interlayer insulating film 48 and the conductive plugs 47A and 47C; thus the orientation of crystal grains of the plugs 47A and 47C may be screened from the influence of (002) orientation of the Ti film 51 even though the Ti film 51 may show strong (002) orientation on the conductive plugs 47A and 47C, because the SiCH film 49 lies between the Ti film 51 and the conductive plugs 47A and 47B.

Further, in the process step of FIG. 6F, the Ti film 51 is deposited at a temperature less than approximately 300° C., for example, at approximately 20° C. Thereby, the SiCH film 49 made of the Si compound may be prevented from desorption of CH group in the SiCH film 49 while deposition of the Ti film 51 is performed. Further, as the sputtering for forming the Ti film 51 is performed at relatively low power, approximately 2.6 kW, Ti atoms having been sputtered have relatively low kinetic energy; thus it may be avoided that Ti atoms penetrate the SiCH film 49 and reach the interlayer insulating film 48.

Figure 6G:
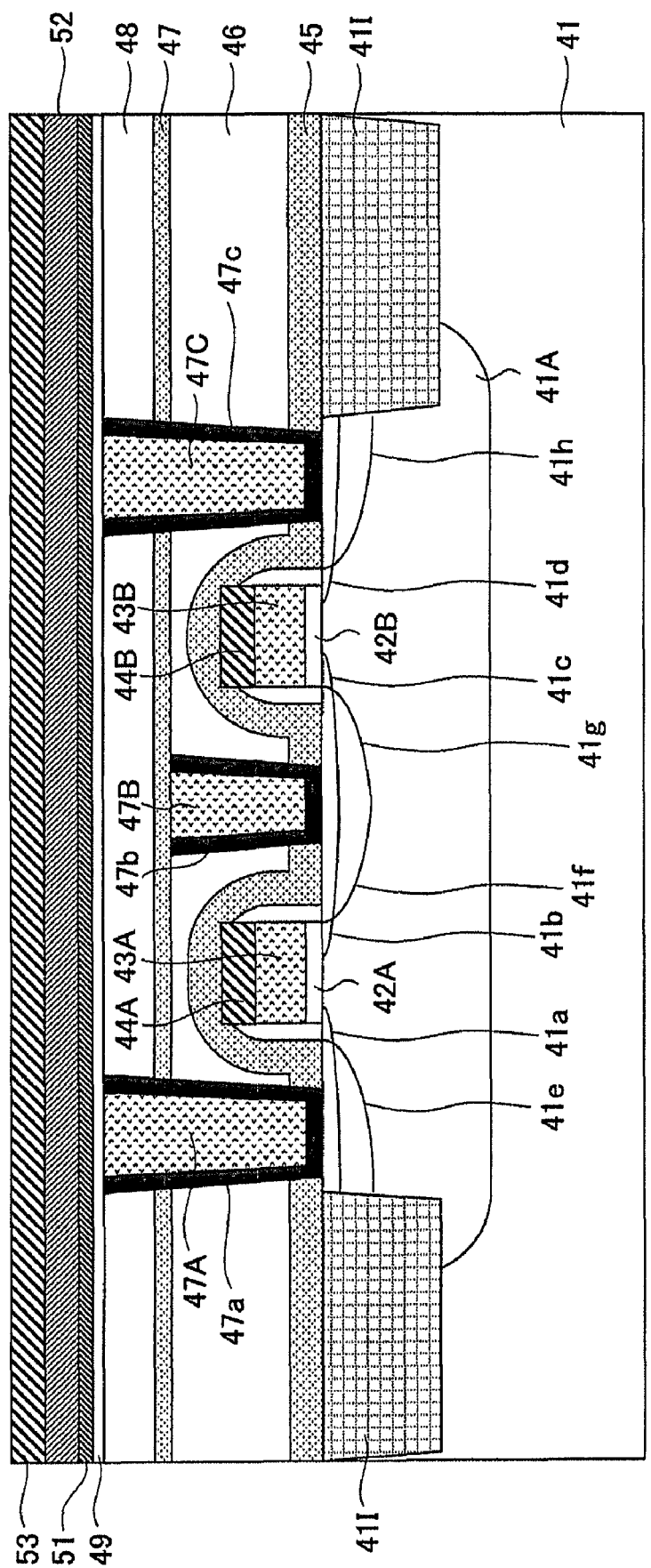
FIG. 6G is an illustration for describing a fabrication process (step 7) of the ferroelectric memory device of FIG. 5.

In the process of FIG. 6G, an approximately 100 nm thick TiAlN film is formed on the structure of FIG. 6F as a first lower electrode film 52 by a sputtering technique using a Ti—Al alloy target called reactive sputtering, under a mixed atmosphere of Ar gas and nitrogen gas under pressure of approximately 253.3 Pa at a substrate temperature of approximately 400° C. with a sputtering power of approximately 1.0 kW. The flow rates of Ar gas and nitrogen gas may be approximately 40 SCCM and 10 SCCM, respectively. An approximately 100 nm thick Ir film 53 is formed on the TiAlN film 52 as a second lower electrode film by a sputtering technique in Ar atmosphere under pressure of approximately 0.11 Pa at substrate temperature of approximately 500° C. with sputtering power of approximately 0.5 kW.

Further, the Ir film 53 may be replaced by platinum group metals such as Pt or conductive oxide materials such as PtO, $IrO_x$, and $SrRuO_3$. The lower electrode film 53 may be made of metals above or stacked films formed by oxide metals.

Figure 6H:
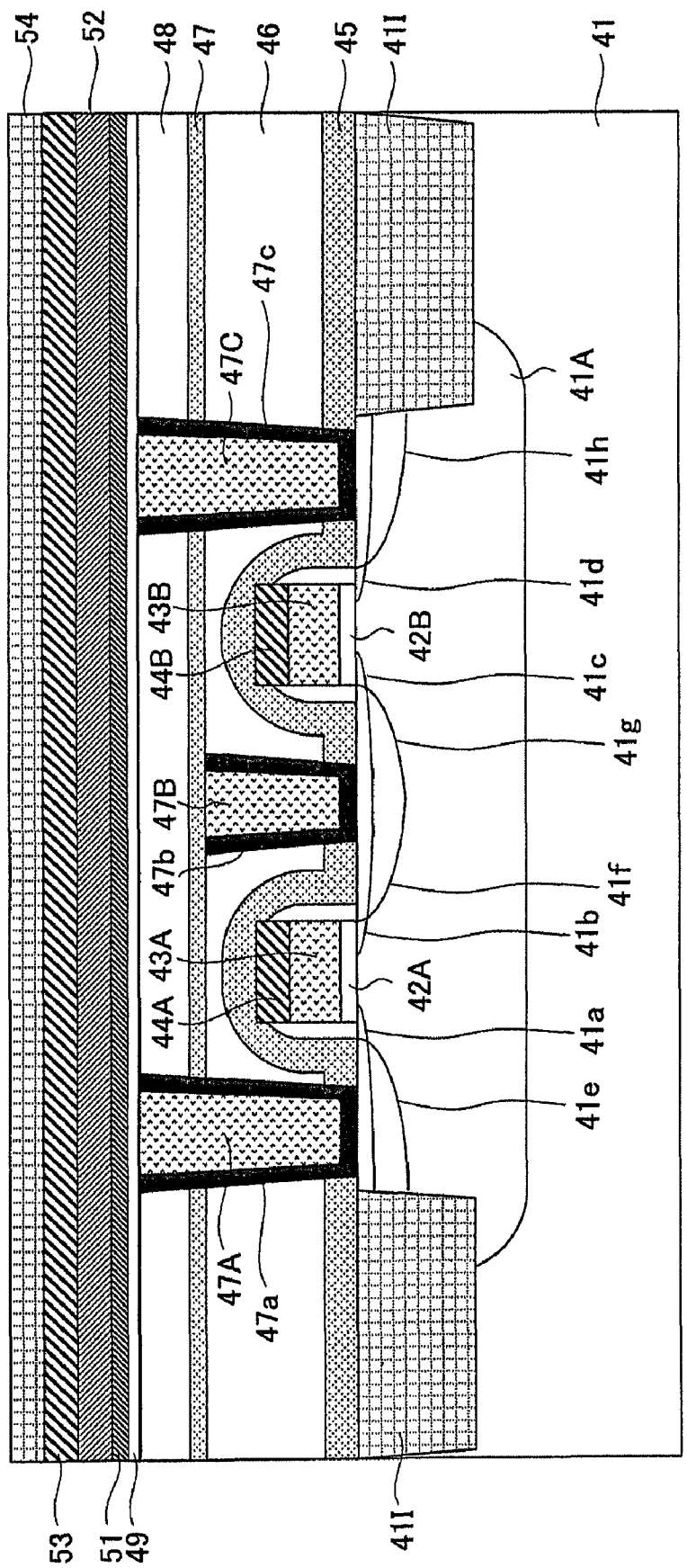
FIG. 6H is an illustration for describing a fabrication process (step 8) of the ferroelectric memory device of FIG. 5.

Next, in FIG. 6H, a PZT film is formed on the structure of FIG. 6G as a ferroelectric film 54 by MOCVD technique.

More specifically, individual liquid sources of Pb, Zr and Ti are prepared by resolving $Pb(DPM)_2$, $Zr(dmhd)_4$ and $Ti(O-iOr)_2(DPM)_2$ into THF solvents with concentrations of approximately 0.3 mol/l. Further, the individual liquid sources are supplied to the evaporator of a MOCVD system with flow rates of approximately 0.326 ml/min, approximately 0.200 ml/min, and approximately 0.200 ml/min, respectively, accompanying a THF solvent with a flow rate of 0.474 ml/min. As a result, Pb, Zr and Ti source gases are formed by evaporating the individual liquid sources.

Further, in the process step of FIG. 6H, the structure of FIG. 6G is placed in the MOCVD furnace under a pressure of approximately 665 Pa (approximately 5 Torr) while holding a substrate temperature of approximately 620° C., and supplying the prepared Pb, Zr, and Ti source gases on the structure of FIG. 6G in the MOCVD furnace, which is operated for approximately 620 seconds. Thereby, a predetermined PZT film 54 is formed approximately 120 nm on the lower electrode 53.

Figure 6I:
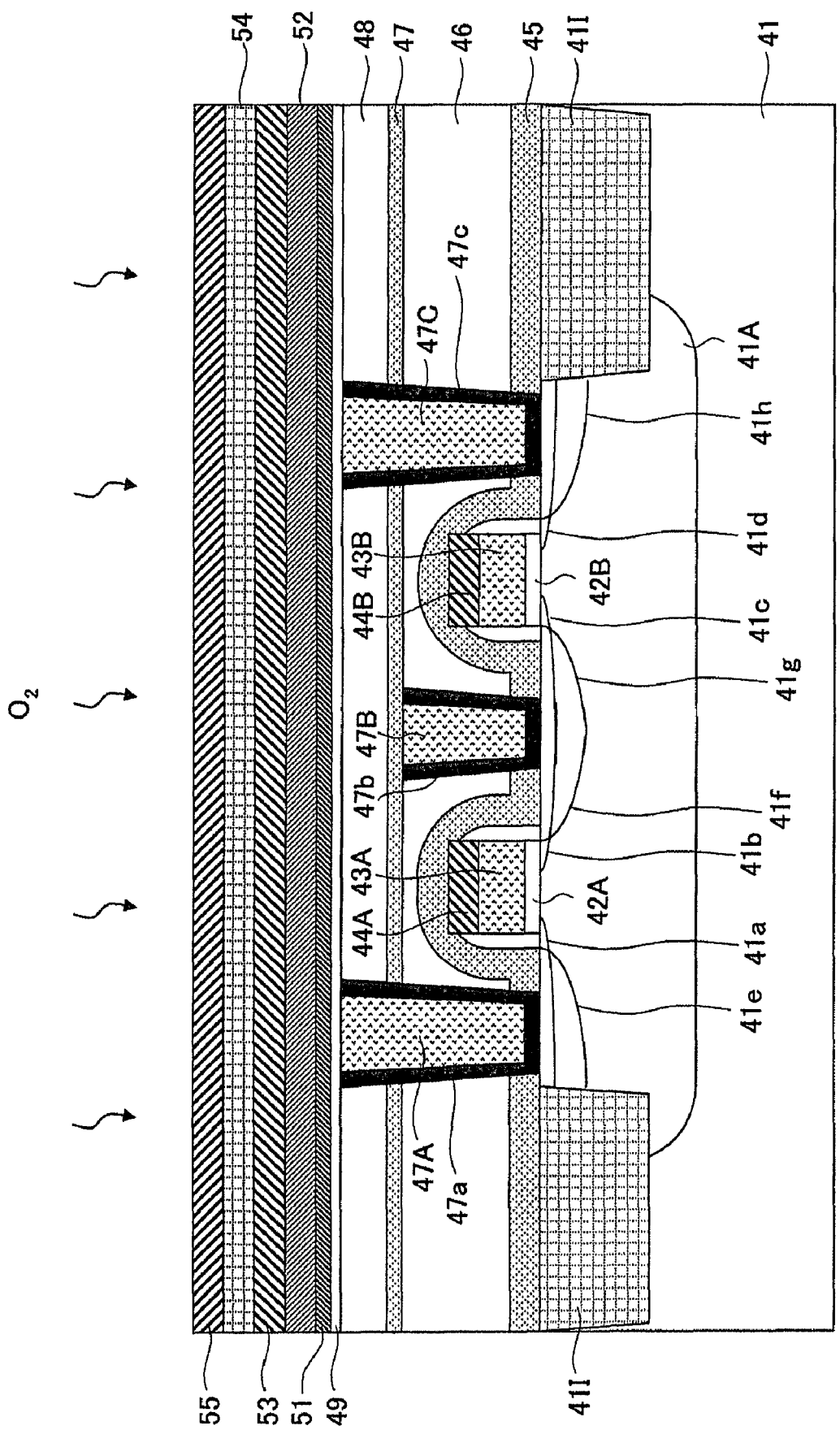
FIG. 6I is an illustration for describing a fabrication process (step 9) of the ferroelectric memory device of FIG. 5.

Next, in the process of FIG. 6I, the structure of FIG. 6H is maintained at room temperature, and an approximately 200 nm thick iridium oxide film 55 is formed on the structure by a sputtering technique in an Ar atmosphere under a pressure of approximately 0.8 Pa with sputtering power of approximately 1.0 kW for approximately 79 seconds. Further, the obtained structure is annealed at a substrate temperature of approximately 550° C. for approximately 260 seconds in an oxygen atmosphere for crystallizing the PZT film 54 and supplying oxygen atoms to compensate for deficient oxygen in film 54. The Ir film 55 may include an almost stoichiometric composition of $IrO_2$ in the film, which may prevent the ferroelectric film 54 from undergoing catalytic action by hydrogen radicals. Therefore, the ferroelectric capacitor Q1 and the ferroelectric capacitor Q2 may have improved hydrogen resistance.

Figure 6J:
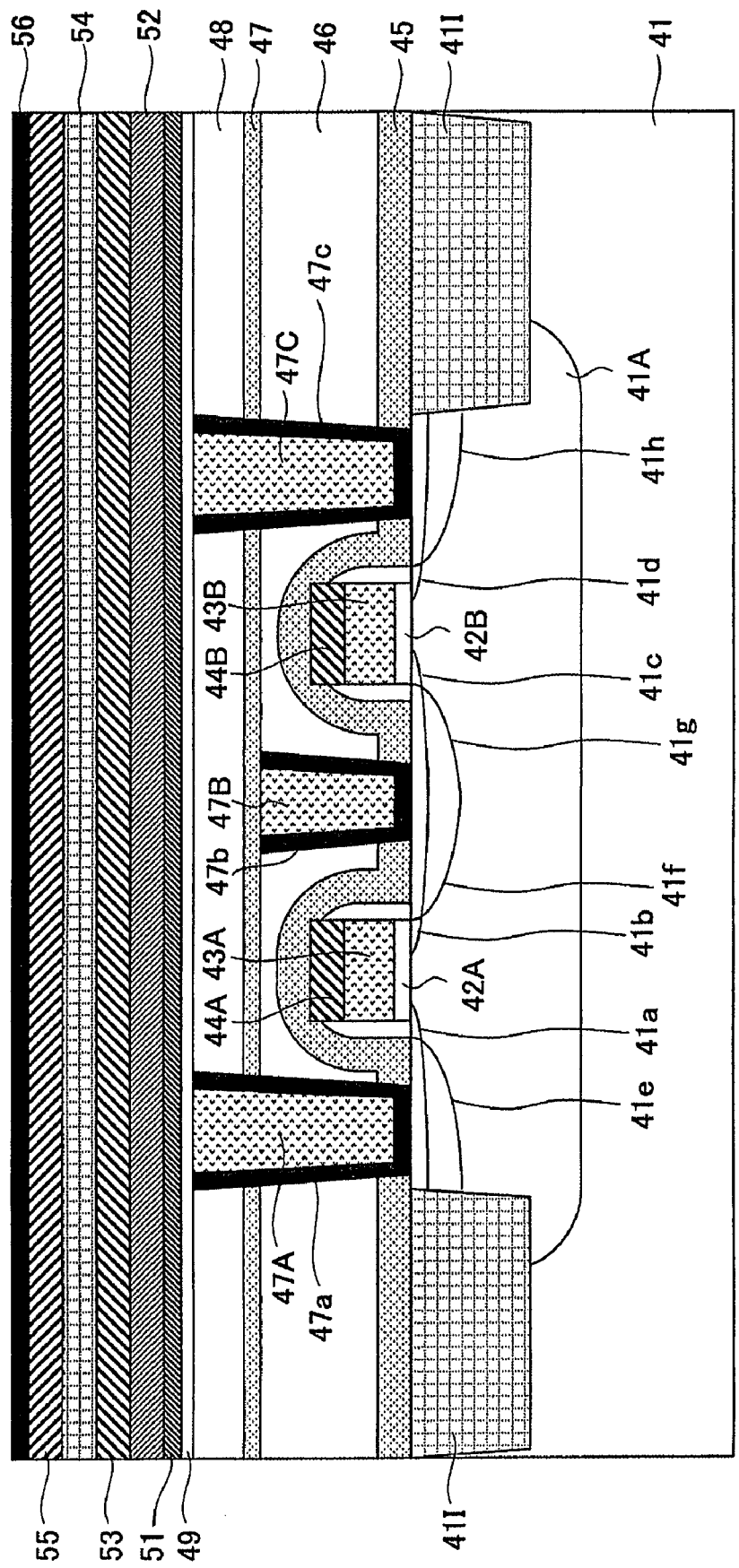
FIG. 6J is an illustration for describing a fabrication process (step 10) of the ferroelectric memory device of FIG. 5.

Further, in the process step of FIG. 6J, an approximately 100 nm thick Ir film 56 is formed on the structure of FIG. 6I as a hydrogen barrier film by a sputtering technique in an Ar atmosphere under pressure of approximately 1 Pa with a sputtering power of approximately 1.0 kW. Further, as other hydrogen barrier films, a Pt film, or a $SrRuO_3$ film may be used.

In the process step of FIG. 6K, the films 49-56 are processed by patterning and the first ferroelectric capacitor Q1 including the films 51A-56A and the second ferroelectric capacitor Q2 including the films 51C-56C are formed.

Figure 6L:
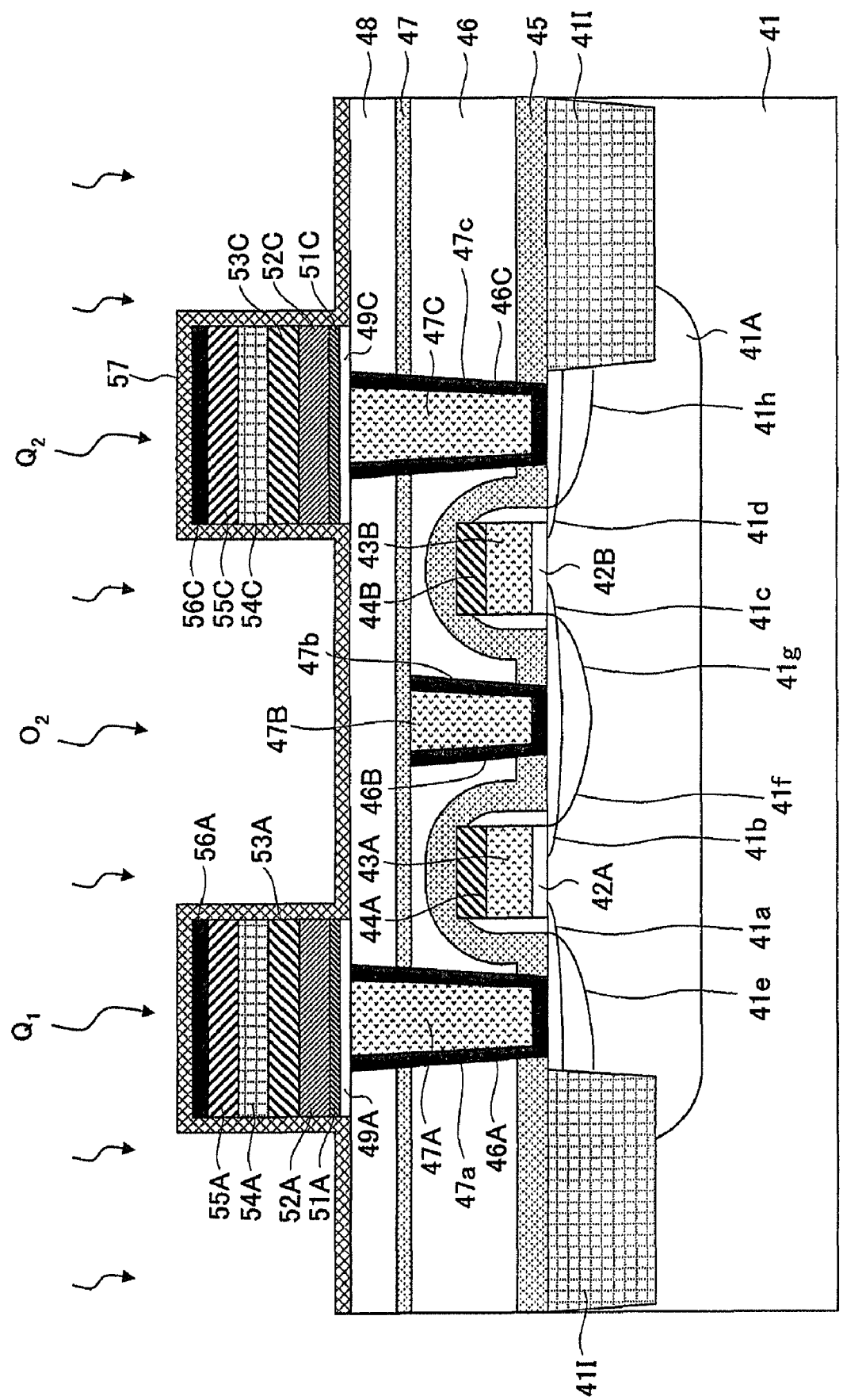
FIG. 6L is an illustration for describing a fabrication process (step 12) of the ferroelectric memory device of FIG. 5.

Further, in the process step of FIG. 6L, thermal annealing in an oxygen atmosphere may be performed at approximately 600° C. for recovering from oxygen deficiency in the ferroelectric capacitors Q1 and Q2, which oxygen deficiency may be caused by patterning processes of the ferroelectric capacitors Q1 and Q2. After the oxygen thermal annealing process, an approximately 20 nm thick $Al_2O_3$ film 57 is formed by a CVD technique.

After the process of FIG. 6L, the third interlayer insulating film 58, shown in FIG. 5, is formed on the $Al_2O_3$ film 57 to cover the ferroelectric capacitors Q1 and Q2 by a high-density plasma CVD technique. Further, in the third interlayer insulating film 58 are formed contact holes 58A, 58B, and 58C. A via plug 59A is formed to contact the upper electrode film 56A of the first ferroelectric capacitor Q1 through the contact hole 58A. A via plug 59B is formed to contact the via plug 47B through the contact hole 58B, and a via plug 59C is formed to contact the upper electrode film 56C through the contact hole 58C. The via plugs 59A, 59B, and 59C include intermediate films 59a, 59b, and 59c, respectively, having Ti/TiN structures.

When the contact holes 58A through 58C are formed in the third interlayer insulating film 58, the contact holes 58A and 58C are formed first to expose the hydrogen barrier films 56A and 56C of the capacitors Q1 and Q2, which is not shown in the figures, and thermal annealing is performed at approximately 550° C. in an oxygen atmosphere for recovering from oxygen deficiency of the PZT films 54A and 54C, because the oxygen deficiency may be caused by forming processes of the contact holes 58A and 58C. Further the contact hole 58B is formed after thermal annealing which is performed after forming the contact holes 58A and 58C.

When the conductive plugs 59A, 59B, and 59C are formed in the contact holes 58A, 58B, and 58C, it is preferable that a single layer TiN film be formed as the intermediate films 59a, 59b, and 59c on the surfaces of the contact holes 58A, 58B, and 58C. The intermediate films 59a, 59b, and 59c may be formed first by a sputtering technique and successively TiN films may be formed by a MOCVD technique. In this case, although a mixed gas plasma treatment using nitrogen gas and hydrogen gas may be required to eliminate carbon atoms from the TiN films, no hydrogen catalytic problem may be caused in the upper electrodes 55A and 55C because the hydrogen barrier films 56A and 56C including Ir films are formed on the upper electrodes 55A and 55C.

Further, the wiring patterns 60A, 60B, and 60C are formed on the third interlayer insulating film 58 to correspond to the via plugs 58A, 58B, and 58C, respectively.

Figure 9:
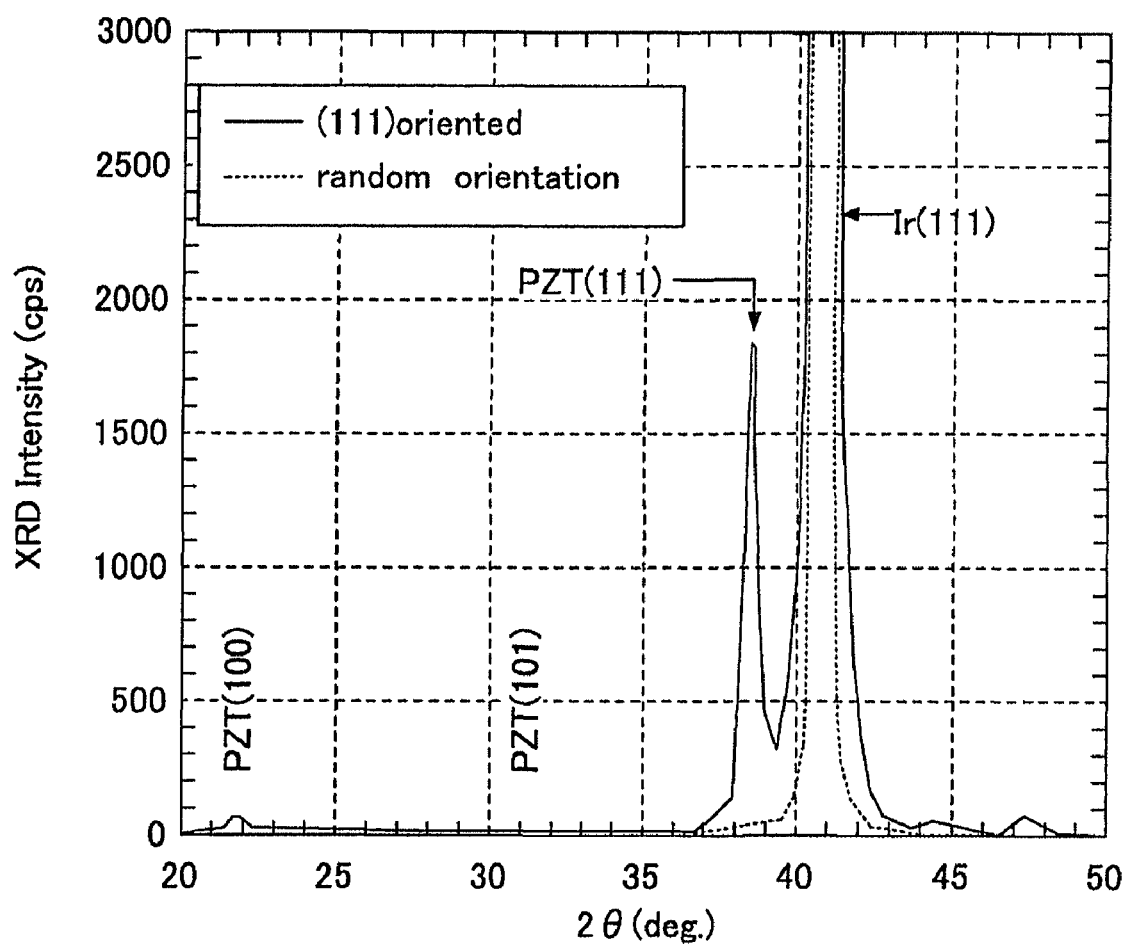
FIG. 9 is a diagram showing a result of an X-ray diffraction measurement of a PZT film formed by the process of the FIG. 6H.

FIG. 9 shows a result of an X-ray diffraction measurement for the PZT film 54 formed by the process above.

Referring FIG. 9, a strong peak corresponding to (111) orientation of PZT film is seen for a structure having a SiCH film 49A between the conductive plug 47A and the Ti film 51A and a structure having a SiCH film 49C between the conductive plug 47C and the Ti film 51A. Diffraction peaks indicating (100) plane orientation and (101) plane orientation of PZT are almost negligible, so that the ferroelectric films 54A and 54B having (111) orientated PZT films are actually obtained, and even for PZT films formed on the conductive plugs 47A and 47B.

Figure 10:
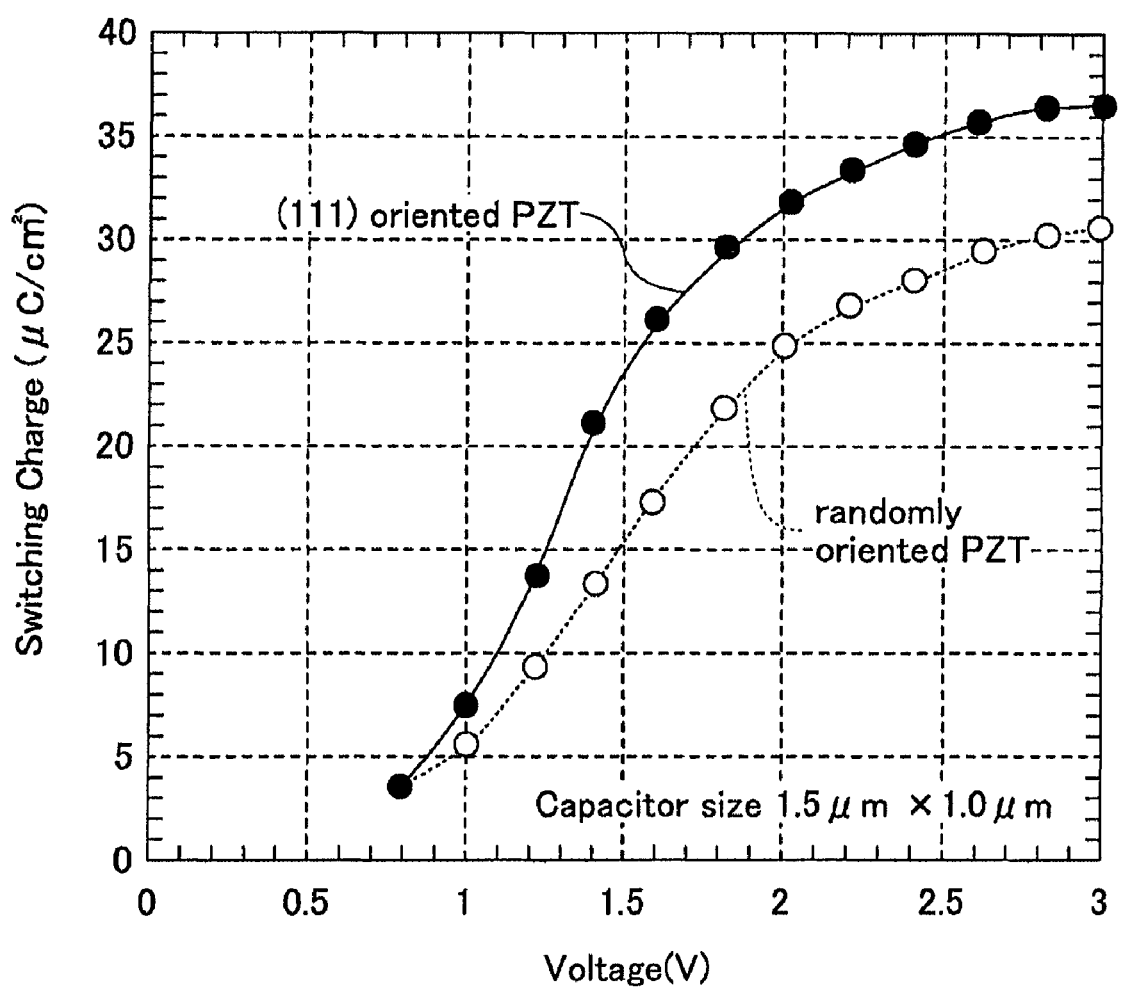
FIG. 10 is a diagram showing switching charge characteristics of a ferroelectric capacitor used for a ferroelectric memory device of FIG. 5.

FIG. 10 shows switching charge $Q_{sw}$ characteristics of a (111) oriented PZT film and a randomly oriented PZT film. Ferroelectric capacitors having size of 1.5 μm×1.0 μm are used for switching charge measurements.

Referring FIG. 10, it is seen that the switching charge $Q_{sw}$ of (111) oriented PZT film is much larger than that of randomly oriented PZT film.

Figure 11:
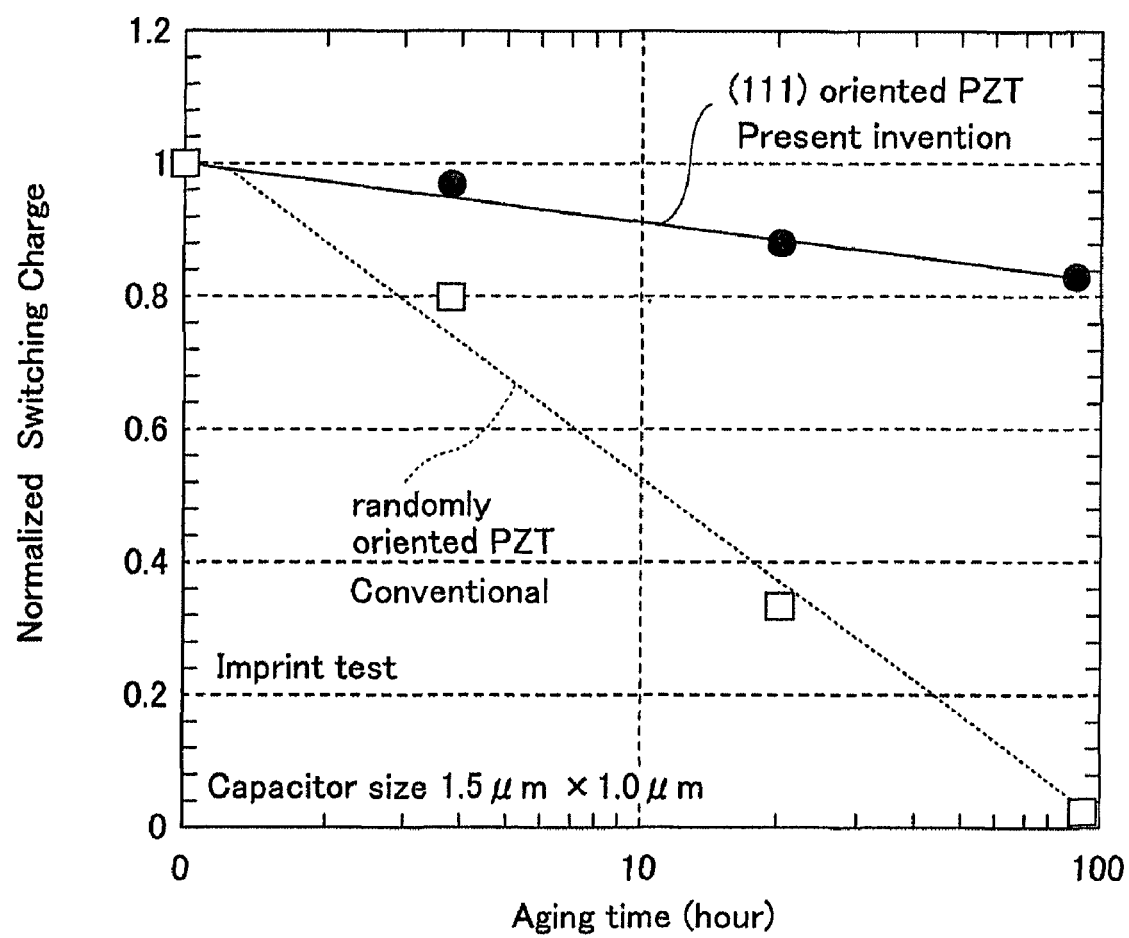
FIG. 11 is a diagram showing imprint characteristics of a capacitor used for a ferroelectric memory device of FIG. 5.

FIG. 11 shows imprint characteristics of (111) oriented PZT film and randomly oriented PZT film. In the measurement, ferroelectric capacitors having size of 1.5 μm×1.0 μm are used.

Referring FIG. 11, the switching charge $Q_{sw}$ of (111) oriented PZT film decreases by only approximately 20% after 100 hours. In contrast, it is seen that the switching charge of randomly oriented PZT film rapidly decreases with time.

As described before, in the present embodiment, electrical characteristics of PZT film 54A and 54B are improved by inserting the SiCH film 49 of the Si compound under the self-orientation Ti film to be aligned in (002) orientation in the process of FIG. 6E so that nitrogen atoms of the Ti film 51 may be prevented from binding oxygen atoms in the oxide film 48 which is under the Ti film 51.

Further, as described above, it may be regarded that the SiOCH films 49A and 49C become to include CH groups in the SiOC films at the process step of FIG. 6L through repeated thermal annealing in oxygen atmosphere such as in FIG. 6I.

The present embodiment may provide a simple process which includes preferable advantages for effective productivity.

Second Embodiment

Figure 12:
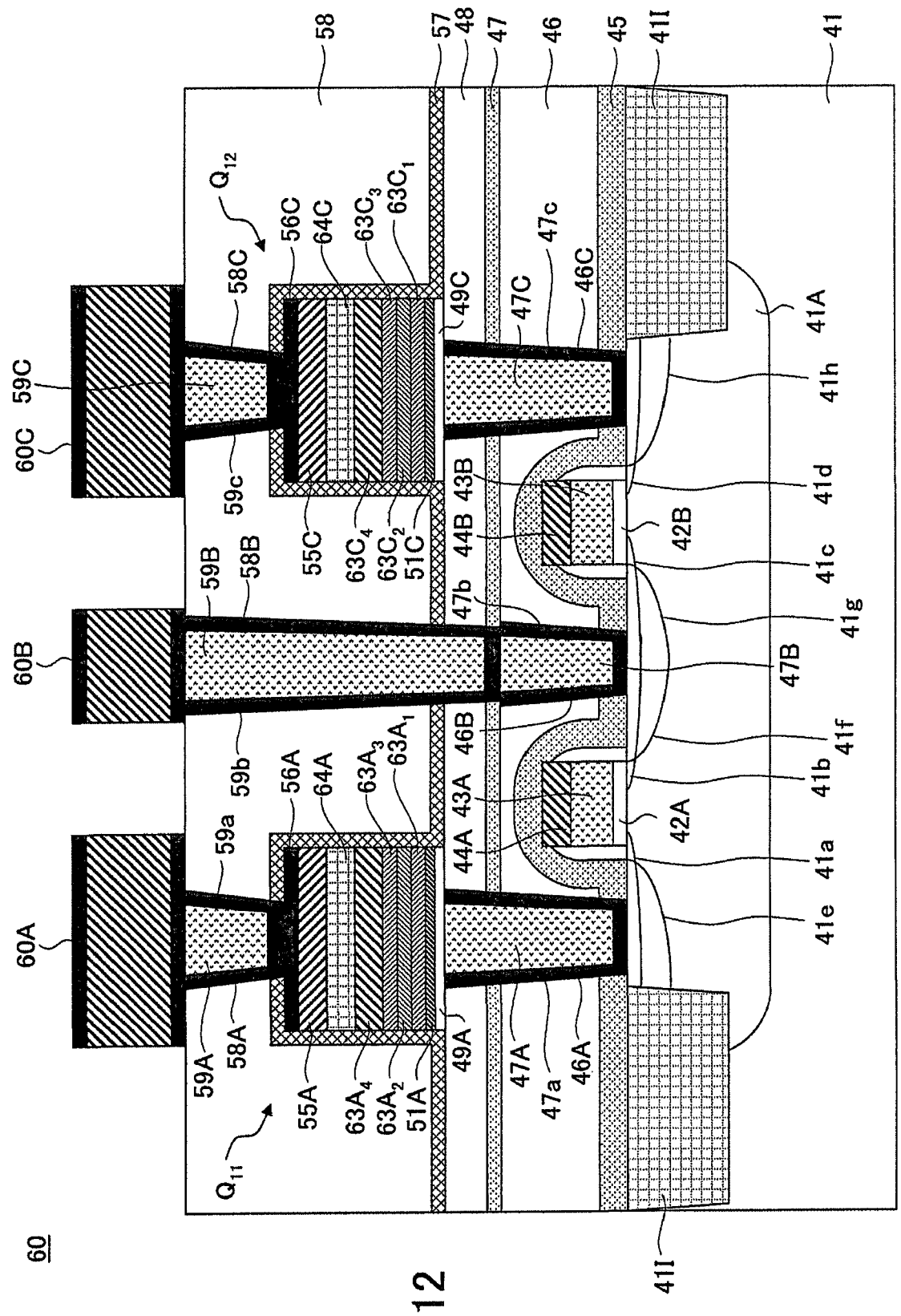
FIG. 12 is an illustration showing a configuration of a ferroelectric memory device according to a second embodiment.

FIG. 12 shows a ferroelectric memory device 60 related to a second embodiment of the present embodiment. Parts in FIG. 12 previously described are be indicated by corresponding signs and the descriptions will be omitted.

Referring FIG. 12, the ferroelectric memory device 60 includes a similar configuration to the ferroelectric memory device 40 as described in FIG. 5. The PZT films 54A and 54C are replaced by PZT films 64A and 64C formed by a sputtering technique for forming the ferroelectric capacitors Q11 and Q12. According to this change, the ferroelectric capacitor Q11 may include a lower electrode that includes four layers of an approximately 100 nm thick Ir film 63A1, an approximately 20 nm thick IrO$_x$ film 63A2, an approximately 20 nm thick PtO$_x$ film 63A3, and an approximately 100 nm thick Pt film 63A4.

Likewise, the ferroelectric capacitor Q12 may include a lower electrode that includes four layers of an approximately 100 nm thick Ir film 63C1, an approximately 20 nm thick IrO$_x$ film 63C2, an approximately 20 nm thick PtO$_x$ film 63C3, and an approximately 100 nm thick Pt film 63C4.

The films 63A1 through 63A4 and the films 63C1 through 63C4 are formed by a sputtering technique in the present embodiment. Further the PZT films 64A and 64C are formed using a PZT target in an Ar atmosphere under approximately 1 Pa by applying plasma power, in which the PZT target is formed by a composition expressed by Pb/(Zr+Ti)=1.03, and includes approximately 1% through approximately 2% of Ca and approximately 1% through approximately 2% of La.

The ferroelectric capacitors Q11 and Q12 formed according to the above are repeatedly annealed in an oxygen atmosphere for compensating for oxygen deficiency in the films as described in the previous embodiment.

In the present embodiment, as SiCH films 49A and 49C are formed on the surfaces of conductive plugs 47A and 47C, the orientation of crystal grains of the conductive plugs 47A and 47C give no influence to the orientation of Ti self-orientation films 51A and 51C, so that the Ti films 51A and 51C may show ideal (002) orientation.

Thereby, an Ir film, a Pt film and a PZT film formed on the Ti films may have strong (111) orientation.

For each embodiment, it is described that the SiCH films 49, 49A, and 49C are formed by spin-coating of HMDS including methyl group film. Such SiCH films may be formed by using an organic silicon compound such as dimethyl-diethoxy-silane (DMDMOS) or tetra-methoxy-silane (TMOS). Further, such SiCH films may include alkyl group members such as $C_2H_5$ or the like. Further, such SiCH films may be formed by a plasma CVD technique.

It is described that the self-orientation films 51A and 51C are Ti films. Further, it may be possible to use other self-orientation films such as a Ir film, a Pt film, a PZT film, a SrRuO$_3$ film, a Ru film, a TiN film, a TiAlN film, a Cu film, and an IrO$_x$ film.

For each embodiment, it is described that the conductive plugs 47A-47C and 59A-59C are formed by W plugs. Further, it may be possible to use other materials, such as poly silicon, Ti, TiN, TiAlN, Al, Cu, Ru, and SrRuO$_3$.

Further, in each embodiment, it is described that the ferroelectric films 54A and 54C are formed by PZT films. Further, it is possible to use other films such as a PLZT films, PZT solid solution composite film or the like. As the ferroelectric films 54A and 54C, it is possible to use other perovskite films such as BaTiO$_3$ films, (Bi$_{1/2}$Na$_{1/2}$)TiO$_3$ films, KNbO$_3$ films, NaNbO$_3$ films, LiNbO$_3$ films or the like.

Further, the present embodiment may be advantageous not only for ferroelectric memory devices but for manufacturing semiconductor devices having functional films that apply crystal orientation.

Although the embodiment has been described with respect to specific embodiments for a complete and clear disclosure, the appended claims are not to be thus limited but are to be construed as embodying all modifications and alternative constructions that may occur to one skilled in the art that fairly fall within the basic teachings herein set forth.

What is claimed is:

1. A ferroelectric memory device manufacturing method, comprising:
   forming an interlayer isolating film for covering a transistor formed over a semiconductor substrate;
   forming a conductive plug in the interlayer insulating film to contact a diffusion region of the transistor formed on the semiconductor substrate;
   forming a ferroelectric capacitor over the conductive plug by stacking in the order of a lower electrode, a ferroelectric film and an upper electrode; and
   forming a compound film including silicon (Si) and a CH group on a surface of the interlayer insulating film and a surface of the conductive plug by depositing an Si compound containing Si atoms and the CH groups after forming the conductive plug and before forming the lower electrode; and
   forming a self-orientation film on a surface of the compound film.

2. The ferroelectric memory device manufacturing method as claimed in claim 1, wherein the Si compound comprises hexamethyldisilazane.

3. The ferroelectric memory device manufacturing method as claimed in claim 1, wherein the self-orientation film is formed at a temperature equal to or less than approximately 300° C.

4. The ferroelectric memory device manufacturing method as claimed in claim 3, wherein the self-orientation film is formed of a Ti film using a sputtering technique.

5. A manufacturing method of a semiconductor device including a functional film, comprising:

forming an interlayer isolating film for covering a transistor formed over a semiconductor substrate;

forming a conductive plug in the interlayer insulating film to contact a diffusion region of the transistor formed on the semiconductor substrate;

forming a functional film over the conductive plug; and forming a compound film including silicon (Si) and a CH group on a surface of the interlayer insulating film and a surface of the conductive plug by depositing an Si compound containing Si atoms and the CH groups after forming the conductive plug and before forming the functional film; and forming a self-orientation film over a surface of the compound film.

6. A ferroelectric memory device, comprising:

a semiconductor substrate;

a transistor formed on the semiconductor substrate, the transistor including a first diffusion region and a second diffusion region;

an interlayer insulating film formed over the semiconductor substrate for covering the transistor;

a conductive plug formed in the interlayer insulating film to contact the first diffusion region; and a ferroelectric capacitor formed over the interlayer insulating film, the ferroelectric capacitor contacting the conductive plug;

wherein the ferroelectric capacitor is inserted between an upper electrode and a lower electrode, the lower electrode being in electrical contact with the conductive plug;

a SiOC film is formed between the conductive plug and the lower electrode; and a self-orientation film including a self-orientation material is formed in between the SiOC film and the lower electrode.

* * * * *